US012733466B2

(12) United States Patent
Xu et al.

(10) Patent No.: US 12,733,466 B2
(45) Date of Patent: Sep. 8, 2026

(54) INTEGRATED PVD TUNGSTEN LINER AND SEAMLESS CVD TUNGSTEN FILL

(71) Applicant: Applied Materials, Inc., Santa Clara, CA (US)

(72) Inventors: Yi Xu, San Jose, CA (US); Xianyuan Zhao, Santa Clara, CA (US); Zhimin Qi, Santa Clara, CA (US); Aixi Zhang, Santa Clara, CA (US); Geraldine Vasquez, Santa Clara, CA (US); Dien-Yeh Wu, Santa Clara, CA (US); Wei Lei, Santa Clara, CA (US); Xingyao Gao, San Jose, CA (US); Shirish Pethe, Cupertino, CA (US); Wenting Hou, Sunnyvale, CA (US); Chao Du, Santa Clara, CA (US); Tsung-Han Yang, San Jose, CA (US); Kyoung-Ho Bu, Pleasanton, CA (US); Chen-Han Lin, Sunnyvale, CA (US); Jallepally Ravi, San Ramon, CA (US); Yu Lei, Belmont, CA (US); Rongjun Wang, Dublin, CA (US); Xianmin Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 348 days.

(21) Appl. No.: 18/241,343

(22) Filed: Sep. 1, 2023

(65) Prior Publication Data

US 2024/0087955 A1 Mar. 14, 2024

Related U.S. Application Data

(60) Provisional application No. 63/405,235, filed on Sep. 9, 2022.

(51) Int. Cl.
*H10W 20/00* (2026.01)

(52) U.S. Cl.
CPC ....... *H10W 20/048* (2026.01); *H10W 20/045* (2026.01); *H10W 20/057* (2026.01)

(58) Field of Classification Search
CPC ....................... H01L 21/76856; H10W 20/048
See application file for complete search history.

(56) References Cited

U.S. PATENT DOCUMENTS 6,271,129 B1 8/2001 Ghanayem et al.
7,592,256 B2 9/2009 Okubo et al.
(Continued)

FOREIGN PATENT DOCUMENTS

WO 2020168071 A 9/2010
WO 2020112487 A1 6/2020
(Continued)

OTHER PUBLICATIONS

International Search Report and Written Opinion for International Application No. PCT/US2023/031988 dated Dec. 26, 2023.

*Primary Examiner* — Daniel Luke
(74) *Attorney, Agent, or Firm* — Patterson + Sheridan, LLP

(57) ABSTRACT

A method and apparatus for forming tungsten features in semiconductor devices is provided. The method includes exposing a top opening of a feature formed in a substrate to a physical vapor deposition (PVD) process to deposit a tungsten liner layer within the feature. The PVD process is performed in a first processing region of a first processing chamber and the tungsten liner layer forms an overhang portion, which partially obstructs the top opening of the feature. The substrate is transferred from the first processing region of the first processing chamber to a second processing region of a second processing chamber without breaking vacuum. The overhang portion is exposed to nitrogen-
(Continued)

containing radicals in the second processing region to inhibit subsequent growth of tungsten along the overhang portion. The feature is exposed to a tungsten-containing precursor gas to form a tungsten fill layer over the tungsten liner layer within the feature.

20 Claims, 9 Drawing Sheets

(56) References Cited

U.S. PATENT DOCUMENTS 7,776,698 B2 8/2010 Ye et al.
8,071,478 B2 12/2011 Wu et al.
9,082,826 B2 7/2015 Chandrashekar et al.
9,169,556 B2 10/2015 Wu et al.
9,748,105 B2 8/2017 Wu et al.
9,997,405 B2 * 6/2018 Chandrashekar ....... C23C 16/00
10,170,320 B2 * 1/2019 Wang ................ H01L 21/76877
10,680,008 B2 6/2020 Lee et al.
10,879,114 B1 12/2020 Wu et al.
11,177,387 B2 11/2021 Chen et al.
2005/0032364 A1 2/2005 Okubo et al.
2007/0066060 A1 3/2007 Wang
2007/0117397 A1 5/2007 Fu et al.
2009/0085173 A1 4/2009 Boemmels et al.
2009/0149022 A1 6/2009 Chan et al.
2010/0068881 A1 * 3/2010 Kang ................ H01L 21/76843
438/653
2010/0167527 A1 7/2010 Wu et al.
2010/0317198 A1 12/2010 Antonelli et al.
2011/0223763 A1 9/2011 Chan et al.
2012/0015518 A1 1/2012 Chandrashekar et al.
2013/0012032 A1 1/2013 Liu et al.
2013/0069234 A1 3/2013 Lee et al.
2013/0109164 A1 5/2013 Olsen et al.
2013/0122713 A1 5/2013 Rogers et al.
2014/0106083 A1 4/2014 Wu et al.
2014/0120700 A1 5/2014 Wang et al.
2015/0179461 A1 6/2015 Bamnolker et al.
2016/0351444 A1 12/2016 Schloss et al.
2016/0379879 A1 12/2016 Hotta et al.
2017/0148670 A1 5/2017 Lei et al.
2019/0122923 A1 4/2019 Wang et al.
2019/0148397 A1 5/2019 Lee et al.
2019/0172723 A1 6/2019 Cheng et al.
2019/0206731 A1 7/2019 Chandrashekar et al.
2019/0326168 A1 10/2019 Yang et al.
2020/0185225 A1 6/2020 Wang et al.
2020/0402846 A1 12/2020 Collins et al.
2021/0125832 A1 4/2021 Bhatnagar
2021/0134952 A1 5/2021 Fung
2021/0305059 A1 9/2021 Lai et al.
2021/0320034 A1 10/2021 Lei et al.
2021/0351074 A1 11/2021 Yang et al.
2021/0351136 A1 11/2021 Shen et al.
2022/0068650 A1 * 3/2022 More ................ H01L 21/28518
2022/0068709 A1 * 3/2022 Wang ................ H01L 21/28556
2022/0098731 A1 3/2022 Wu et al.
2022/0130724 A1 4/2022 Cen et al.
2022/0181201 A1 6/2022 Xu et al.
2022/0359279 A1 11/2022 Cen et al.
2024/0209500 A1 * 6/2024 Cen ......................... C23C 16/54
2024/0222128 A1 * 7/2024 Zhao ................. H01L 21/76879

FOREIGN PATENT DOCUMENTS

WO 2020112616 A1 6/2020
WO WO-2020118100 A1 * 6/2020 ............. H10B 43/27

* cited by examiner

INTEGRATED PVD TUNGSTEN LINER AND SEAMLESS CVD TUNGSTEN FILL

CROSS-REFERENCE TO RELATED APPLICATIONS

This application claims the benefit of U.S. Provisional Patent Application Ser. No. 63/405,235, filed Sep. 9, 2022, which is incorporated by reference herein in its entirety.

TECHNICAL FIELD

The present disclosure generally relates to a method and apparatus for forming thin films. More particularly, the disclosure relates to a method and apparatus for forming tungsten features in semiconductor devices.

BACKGROUND

Tungsten (W) is widely used in integrated circuit (IC) device manufacturing to form conductive features where relatively low electrical resistance and relativity high resistance to electromigration are desired. Tungsten may be used as a metal fill material to form horizontal features in a surface of a dielectric material layer, for example, source contacts, drain contacts, metal gate fill, gate contacts, and interconnects. Tungsten may also be used to form vertical features through a dielectric material layer to connect other interconnect features disposed there above and there below, for example, vias.

As critical dimensions on IC devices shrink, past fabrication techniques encounter new hurdles. For example, during filling of a feature with tungsten, the tungsten fill layer can deposit in an upper portion of the feature quicker than a lower portion due to the varying feature widths and higher concentration of precursor gases used to deposit the tungsten fill layer. This can cause void formation within portions of the feature, particularly for high aspect ratio features.

Accordingly, there is a need for processes to fill features with tungsten that are free or substantially free of voids and seams and have low resistivity for various film thicknesses.

SUMMARY

The present disclosure relates to a method and apparatus for forming thin films. More particularly, the disclosure relates to a method and apparatus for forming tungsten features in semiconductor devices.

In one aspect, a method for processing a semiconductor device structure is provided. The method includes exposing at least one feature formed in a substrate to a physical vapor deposition (PVD) process to deposit a tungsten liner layer over the at least one feature. The PVD process is performed in a first processing region of a first processing chamber and the at least one feature is defined by sidewall surfaces and a bottom surface extending between the sidewall surfaces. The method further includes transferring the substrate from the first processing region of the first processing chamber to a second processing region of a second processing chamber without breaking vacuum. The method further includes exposing the tungsten liner layer to nitrogen-containing radicals in the second processing region to passivate exposed portions of the tungsten liner layer. The tungsten liner layer formed along the bottom surface remains substantially unpassivated. The method further includes exposing the feature to a tungsten-containing precursor gas to form a tungsten fill layer over the tungsten liner layer within the at least one feature in the second processing region. Forming the tungsten fill layer includes preferentially growing the tungsten fill layer from the tungsten liner layer formed along the bottom surface.

Embodiments may include one or more of the following. Exposing the feature to the tungsten-containing precursor gas to form the tungsten fill layer over the tungsten liner layer includes a chemical vapor deposition (CVD) process. Exposing the tungsten liner layer to nitrogen-containing radicals in the second processing region includes generating a plasma comprising nitrogen-containing radicals in a remote plasma source (RPS), wherein the plasma is formed from a process gas comprising nitrogen and an inert gas and flowing the nitrogen-containing radicals into the second processing region of the second processing chamber where the substrate is disposed. The method further includes flowing the plasma comprising the nitrogen-containing radicals through an ion filter to remove substantially all ions from the plasma prior to flowing nitrogen-containing radicals into the second processing region. The process gas includes from about 5% to about 20% nitrogen and argon. The method further includes alternating exposing the tungsten liner layer to nitrogen-containing radicals in the second processing region to passivate exposed portions of the tungsten liner layer and exposing the feature to the tungsten-containing precursor gas to form the tungsten fill layer over the tungsten liner layer.

In another aspect, a method for processing a semiconductor device structure is provided. The method includes exposing at least one feature formed in a substrate to a physical vapor deposition (PVD) process to deposit a tungsten liner layer over the at least one feature. The PVD process is performed in a first processing region of a first processing chamber and the at least one feature is defined by sidewall surfaces and a bottom surface extending between the sidewall surfaces. The method further includes transferring the substrate from the first processing region of the first processing chamber to a second processing region of a second processing chamber without breaking vacuum. The method further includes exposing the tungsten liner layer to a first tungsten-containing precursor and a reducing agent to form a boron-tungsten nucleation layer over the tungsten liner layer in the second processing region. The method further includes exposing the boron-tungsten nucleation layer to nitrogen-containing radicals in the second processing region to passivate exposed portions of the boron-tungsten nucleation layer. The method further includes exposing the feature to a second tungsten-containing precursor gas to form a tungsten fill layer over the boron-tungsten nucleation layer within the at least one feature in the second processing region.

Embodiments may include one or more of the following. Exposing the feature to the second tungsten-containing precursor gas to form the tungsten fill layer over the tungsten liner layer includes a chemical vapor deposition (CVD) process. Exposing the boron-tungsten nucleation layer to nitrogen-containing radicals in the second processing region includes generating a plasma comprising nitrogen-containing radicals in a remote plasma source (RPS). The plasma is formed from a process gas comprising nitrogen and an inert gas. The method further includes flowing the nitrogen-containing radicals into the second processing region of the second processing chamber where the substrate is disposed. The method further includes flowing the plasma comprising the nitrogen-containing radicals through an ion filter to remove substantially all ions from the plasma prior to flowing nitrogen-containing radicals into the second processing region. The process gas includes from about 5% to about 20% nitrogen and the remainder the inert gas, the inert gas is argon. The method further includes alternating exposing the boron-tungsten nucleation layer to nitrogen-containing radicals in the second processing region to passivate exposed portions of the tungsten liner layer and exposing the feature to the second tungsten-containing precursor gas to form the tungsten fill layer over the tungsten liner layer. Exposing the tungsten liner layer to the first tungsten-containing precursor and the reducing agent comprises repeating cycles of alternately exposing the tungsten liner layer to the first tungsten-containing precursor and the reducing agent. The first tungsten-containing precursor is WF6 and the reducing containing agent is $B_2H_6$.

In yet another aspect, a method for processing a semiconductor device structure is provided. The method includes exposing a top opening of a feature formed in a substrate to a physical vapor deposition (PVD) process to deposit a tungsten liner layer within the feature. The PVD process is performed in a first processing region of a first processing chamber and the tungsten liner layer forms an overhang portion, which partially obstructs the top opening of the feature. The method further includes transferring the substrate from the first processing region of the first processing chamber to a second processing region of a second processing chamber without breaking vacuum. The method further includes exposing the overhang portion to nitrogen-containing radicals in the second processing region to inhibit subsequent growth of tungsten along the overhang portion. The method further includes exposing the feature to a tungsten-containing precursor gas to form a tungsten fill layer over the tungsten liner layer within the feature in the second processing region.

Embodiments may include one or more of the following. Exposing the feature to the tungsten-containing precursor gas to form the tungsten fill layer over the tungsten liner layer comprises a chemical vapor deposition (CVD) process. Exposing the tungsten liner layer to nitrogen-containing radicals in the second processing region includes generating a plasma comprising nitrogen-containing radicals in a remote plasma source (RPS), wherein the plasma is formed from a process gas comprising nitrogen and an inert gas and flowing the nitrogen-containing radicals into the second processing region of the second processing chamber where the substrate is disposed. The method further includes flowing the plasma comprising the nitrogen-containing radicals through an ion filter to remove substantially all ions from the plasma prior to flowing nitrogen-containing radicals into the second processing region. The process gas includes from about 5% to about 20% nitrogen and the remainder the inert gas, the inert gas is argon. The method further includes alternating exposing the tungsten liner layer to nitrogen-containing radicals in the second processing region to passivate exposed portions of the tungsten liner layer and exposing the feature to the tungsten-containing precursor gas to form the tungsten fill layer over the tungsten liner layer.

In another aspect, a non-transitory computer readable medium has stored thereon instructions, which, when executed by a processor, causes the process to perform operations of the above apparatus and/or method.

BRIEF DESCRIPTION OF THE DRAWINGS

So that the manner in which the above-recited features of the present disclosure can be understood in detail, a more particular description of the aspects, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
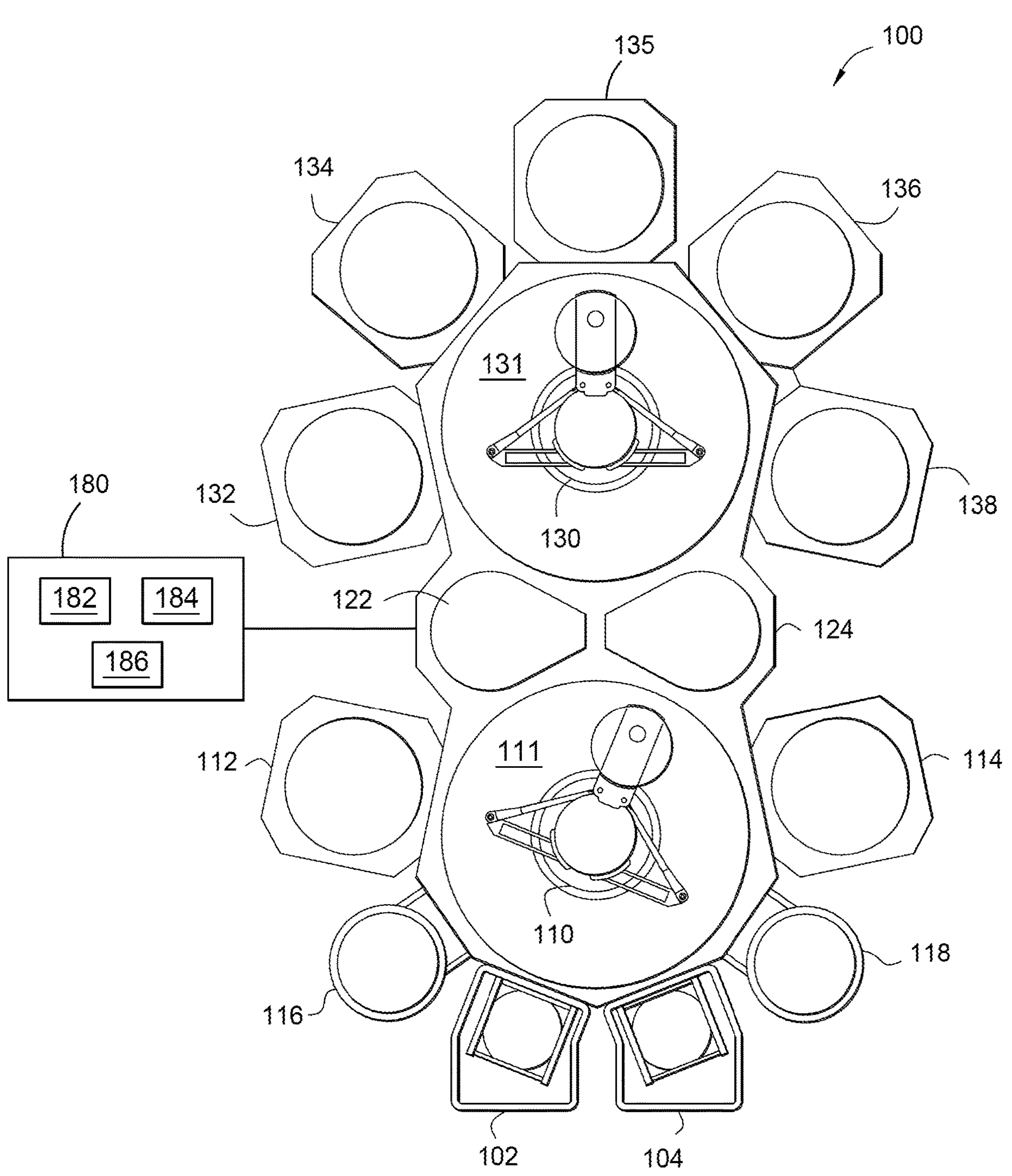
FIG. 1 illustrates a schematic top view of one example of a multi-chamber processing tool in accordance with one or more embodiments of the present disclosure.

The present disclosure relates to a method and apparatus for forming thin films. More particularly, the disclosure relates to a method and apparatus for forming tungsten features in semiconductor devices.

The deposition of gap-fill metal thin films, for example, tungsten-containing thin films, in features with ultra-high aspect ratios is challenging. At earlier nodes, larger dimensions made metal gap-fill possible using nucleation followed by conformal chemical vapor deposition (CVD). However, as the critical dimensions of features continue to shrink, the tops of the ultra-small features are prone to overhang so the conformal process in which the film grows equally on the field region or surface closes or pinches off the opening before filling is complete, leaving voids in the tungsten gap-fill. Even in the absence of voids, center seams are a typical result of conformal deposition as the tungsten gap-fill grows from the sidewall. This incomplete fill may lead to high resistance in the formed device. Tungsten gap-fill may also be adversely affected by the presence of impurities. For example, in some processes there is a vacuum break between PVD processes and CVD processes. This vacuum break exposes already deposited tungsten to oxides, which can lead to the formation of tungsten oxides ($WO_x$). This tungsten oxide can increase resistivity and adversely affect device performance. Further, the presence of tungsten oxide within the feature can affect the incubation of subsequent gap-fill of tungsten in the feature, which contributes to the formation of large seams and voids within the gap-fill. In addition, tungsten oxide may dissolve faster in CMP polishing solutions, which can degrade tungsten adhesion, leading to increased defects after CMP.

Various embodiments provide improved tungsten gap-fill in features having reduced critical dimensions. Various embodiments eliminate the vacuum break between tungsten liner and tungsten fill, which eliminates the formation of tungsten oxide between the tungsten liner and tungsten fill, leading to improved tungsten gapfill and lower CMP defects. Various embodiments achieve seamless tungsten gapfill using only low resistivity materials, for example, PVD tungsten and CVD tungsten, by eliminating the need for high resistivity layers, for example, TiN barrier layers and nucleation layers typically used in conventional tungsten gapfill schemes. The elimination of high resistivity layers also allows for field suppression treatment processes, for example, the nitrogen plasma inhibition treatment process describe herein to be performed directly on the tungsten liner, which also contributes to seamless tungsten gapfill.

Examples of a processing system that may be suitably modified in accordance with the teachings provided herein include an integrated processing system or other suitable processing systems commercially available from Applied Materials, Inc., located in Santa Clara, California. It is contemplated that other processing systems (including those from other manufacturers) may be adapted to benefit from aspects described herein.

FIG. 1 illustrates a schematic top-view diagram of an example multi-chamber processing system 100 or cluster tool that can be used for deposition of a tungsten liner followed by seamless gap-fill of tungsten without breaking vacuum in accordance with one or more embodiments of the present disclosure. The processing system 100 can include one or more load-lock chambers 102, 104 for transferring substrates into and out of the processing system 100. Typically, since the processing system 100 is under vacuum, the load-lock chambers 102, 104 may "pump down" the substrate introduced into the processing system 100. As shown in FIG. 1, a first set of one or more substrate processing chambers 112, 114, 116, 118 (four are shown) are coupled with a first transfer chamber 111. A first transfer robot 110 positioned in the first transfer chamber 111 transfers the substrate between the load-lock chambers 102, 104, and the first set of one or more substrate processing chambers 112, 114, 116, 118. Each substrate processing chamber 112, 114, 116, 118, can be outfitted to perform a number of substrate processing operations including the tungsten deposition processes and nitrogen treatment processes described herein in addition to cyclical layer deposition (CLD), atomic layer deposition (ALD), chemical vapor deposition (CVD), physical vapor deposition (PVD), etch, pre-clean, degas, orientation and other substrate processes.

The first transfer robot 110 can also transfer substrates to/from one or more pass-through chambers 122, 124. The one or more pass-through chambers 122, 124 can be used to maintain ultrahigh vacuum conditions while allowing substrates to be transferred within the processing system 100. As also shown in FIG. 1, a second set of one or more substrate processing chambers 132, 134, 135, 136, and 138 are coupled with a second transfer chamber 131. A second transfer robot 130 positioned in the second transfer chamber 131 can transfer the substrates between the one or more pass-through chambers 122, 124 and a second set of one or more processing chambers 132, 134, 135, 136, and 138. Similar to the substrate processing chambers 112, 114, 116, 118, the substrate processing chambers 132, 134, 135, 136, and 138 can be outfitted to perform a variety of substrate processing operations including the tungsten deposition processes and nitrogen treatment processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate processing chambers 112, 114, 116, 118, 132, 134, 135, 136, and 138 may be removed from the processing system 100 if not necessary for a particular process to be performed by the processing system 100.

A system controller 180 is coupled to the processing system 100 for controlling the processing system 100 or components thereof. For example, the system controller 180 may control the operations of the processing system 100 using a direct control of the substrate processing chambers 112, 114, 116, 118, 132, 134, 135, 136, and 138 of the processing system 100 or by controlling controllers associated with the substrate processing chambers 112, 114, 116, 118, 132, 134, 135, 136, and 138. In operation, the system controller 180 enables data collection and feedback from the respective chambers to coordinate performance of the processing system 100.

The system controller 180 generally includes a central processing unit (CPU) 182, memory 184, and support circuits 186. The CPU 182 may be one of any form of a general purpose processor that can be used in an industrial setting. The memory 184, non-transitory computer-readable medium, or machine-readable storage device, is accessible by the CPU 182 and may be one or more of memory such as random-access memory (RAM), read only memory (ROM), or any other form of digital storage, local or remote. The support circuits 186 are coupled to the CPU 182 and may comprise cache, clock circuits, input/output subsystems, power supplies, and the like. The various embodiments disclosed in the present disclosure may generally be implemented under the control of the CPU 182 by executing computer instruction code stored in the memory 184 (or in memory of a particular processing chamber) as, for example, a computer program product or software routine. That is, the computer program product is tangibly embodied on the memory 184 (or non-transitory computer-readable medium or machine-readable storage device). When the computer instruction code is executed by the CPU 182, the CPU 182 controls the chambers to perform operations in accordance with the various embodiments.

The instructions in memory 184 are in the form of a program product, such as a program that implements the methods of the present disclosure. In one example, the disclosure may be implemented as a program product stored on computer-readable storage media for use with a computer system. The program(s) of the program product define functions of the embodiments (including the methods described herein). Thus, the computer-readable storage media, when carrying computer-readable instructions that direct the functions of the methods described herein, are embodiments of the present disclosure. The system controller 180 is configured to perform methods such as the methods 300A-C stored in the memory 184.

In particular embodiments, at least one of the substrate processing chambers 112, 114, 116, 118, 132, 134, 135, 136, and 138 is a PVD chamber configured to perform the PVD tungsten deposition process of operation 320 of the methods 300A-C and another of the substrate processing chambers 112, 114, 116, 118, 132, 134, 135, 136, and 138 is a CVD chamber, for example, the processing system 200 configured to perform operations 340-380 of the methods 300A-C without breaking vacuum between any of the operations 320-380.

In operation, a substrate having a feature formed therein may be transferred to a first processing chamber which is one of the substrate processing chambers 112, 114, 116, 118, 132, 134, 135, 136, and 138 where a PVD tungsten liner is deposited over the feature. The substrate may then be transferred to a second processing chamber which is one of the substrate processing chambers 112, 114, 116, 118, 132, 134, 135, 136, and 138 without breaking vacuum, the PVD tungsten liner is exposed to a nitrogen plasma inhibition treatment process, optionally followed by a nucleation layer deposition process in the second processing chamber, followed by tungsten gapfill in the second processing chamber.

Figure 2A:
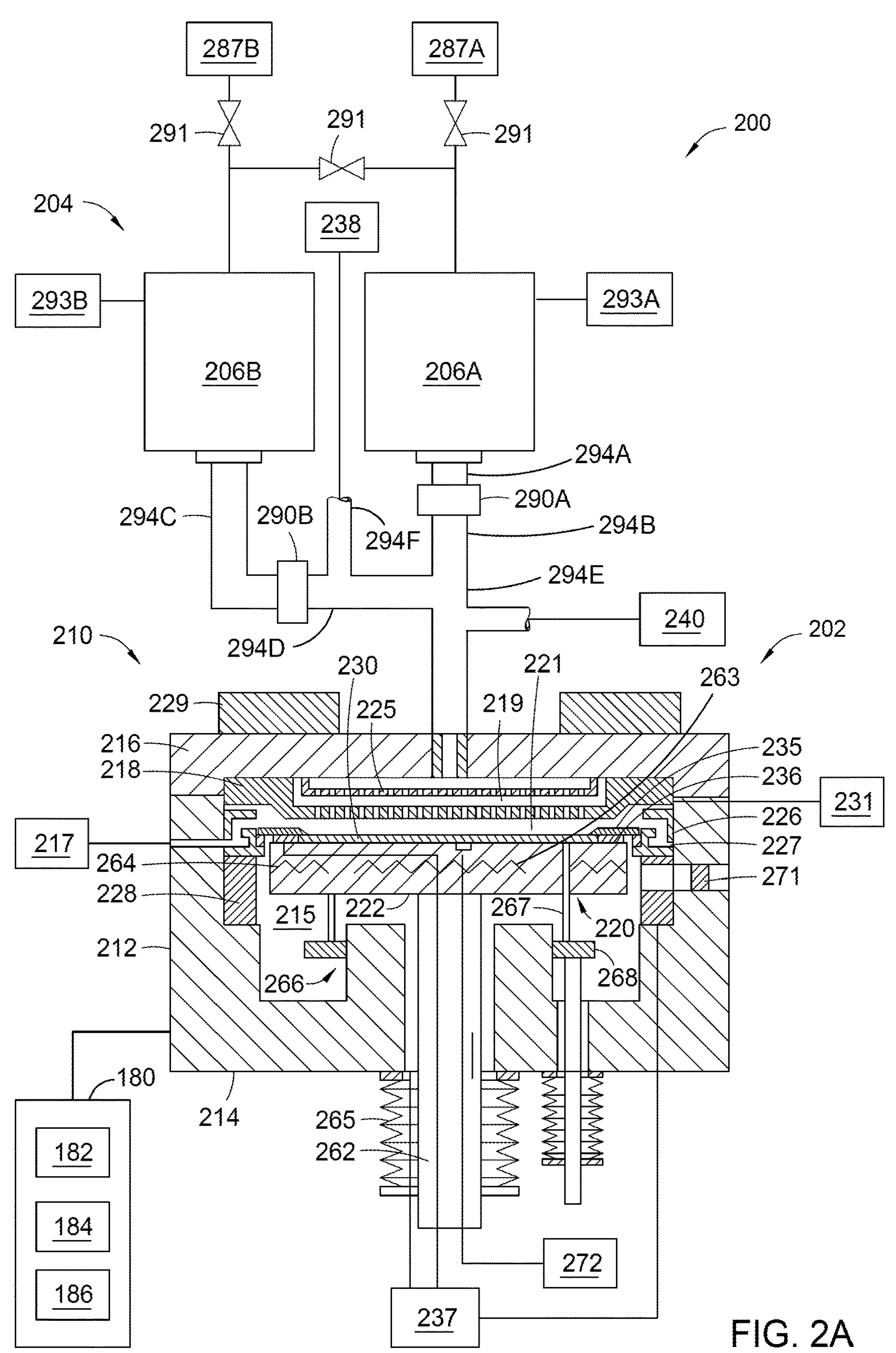
FIG. 2A is a schematic side view of a processing system that may be used to implement the methods set forth herein in accordance with one or more embodiments of the present disclosure.
Figure 2B:
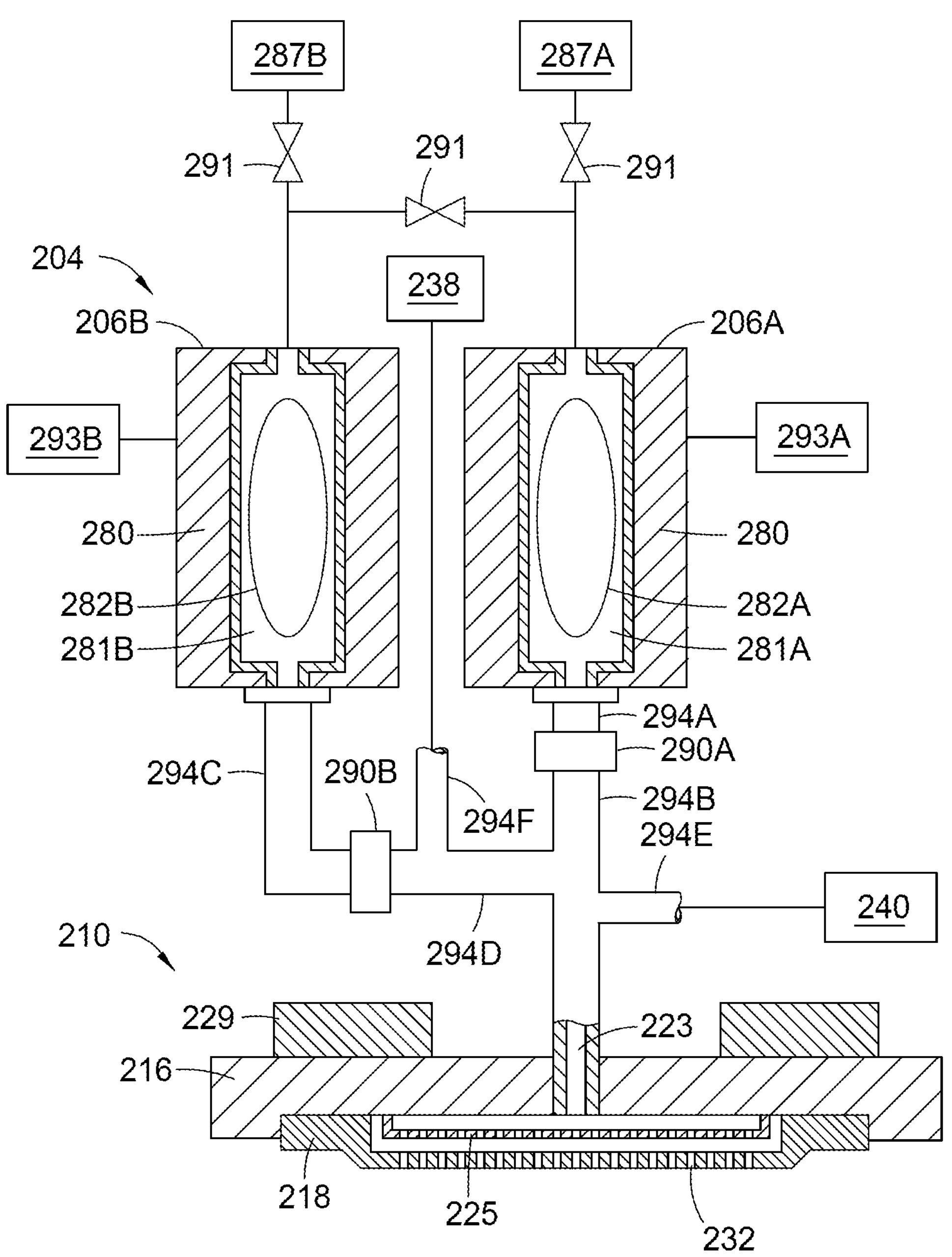
FIG. 2B is a close-up sectional view of a portion of the processing system shown in FIG. 2A in accordance with one or more embodiments of the present disclosure.

FIGS. 2A-2B schematically illustrate a processing system 200 that may be used to perform the bottom-up tungsten gapfill substrate processing methods described herein. Here, the processing system 200 is configured to provide the different processing conditions desired for each of a nucleation process, for example, operation 340, a nitrogen plasma inhibition treatment process, for example, operation 350, and a selective gapfill process, for example, operations 360-380 within a single processing chamber 202, without transferring a substrate between a plurality of processing chambers.

As shown in FIG. 2A, the processing system 200 includes a processing chamber 202, a gas delivery system 204 fluidly coupled to the processing chamber 202, and the system controller 180. The processing chamber 202 (shown in cross-section in FIG. 2A) includes a chamber lid assembly 210, one or more sidewalls 212, and a chamber base 214, which collectively define a processing volume 215. The processing volume 215 is fluidly coupled to an exhaust 217, such as one or more vacuum pumps, used to maintain the processing volume 215 at sub-atmospheric conditions and to evacuate processing gases and processing by-products therefrom.

The chamber lid assembly 210 includes a lid plate 216 and a showerhead 218 coupled to the lid plate 216 to define a gas distribution volume 219 therewith. Here, the lid plate 216 is maintained at a desired temperature using one or more heaters 229 thermally coupled thereto. The showerhead 218 faces a substrate support assembly 220 disposed in the processing volume 215. As discussed below, the substrate support assembly 220 is configured to move a substrate support 222, and thus a substrate 230 disposed on the substrate support 222, between a raised substrate processing position (as shown) and a lowered substrate transfer position (not shown). When the substrate support assembly 220 is in the raised substrate processing position, the showerhead 218 and the substrate support 222 define a processing region 221.

The gas delivery system 204 is fluidly coupled to the processing chamber 202 through a gas inlet 223 (FIG. 2B) that is disposed through the lid plate 216. Processing or cleaning gases delivered, by use of the gas delivery system 204, flow through the gas inlet 223 into the gas distribution volume 219 and are distributed into the processing region 221 through a plurality of openings 232 (FIG. 2B) in the showerhead 218. In one embodiment which can be combined with other embodiments, the chamber lid assembly 210 further includes a perforated blocker plate 225 disposed between the gas inlet 223 and the showerhead 218. In those embodiments, gases flowed into the gas distribution volume 219 are first diffused by the perforated blocker plate 225 to, together with the showerhead 218, provide a more uniform or desired distribution of gas flow into the processing region 221.

The processing gases and processing by-products are evacuated radially outward from the processing region 221 through an annular channel 227 that surrounds the processing region 221. The annular channel 227 may be formed in a first annular liner 226 disposed radially inward of the one or more sidewalls 212 (as shown) or may be formed in the one or more sidewalls 212. In one embodiment which can be combined with other embodiments, the processing chamber 202 includes one or more second liners 228, which are used to protect the interior surfaces of the one or more sidewalls 212 or chamber base 214 from corrosive gases and/or undesired material deposition.

In one embodiment which can be combined with other embodiments, a purge gas source 237 in fluid communication with the processing volume 215 is used to flow a chemically inert purge gas, such as argon (Ar), into a region disposed beneath the substrate support 222, e.g., through the opening in the chamber base 214 surrounding a movable support shaft 262. The purge gas may be used to create a region of positive pressure below the substrate support 222 (when compared to the pressure in the processing region 221) during substrate processing. Typically, purge gas introduced through the chamber base 214 flows upwardly therefrom and around the edges of the substrate support 222 to be evacuated from the processing volume 215 through the annular channel 227. The purge gas reduces undesirable material deposition on surfaces beneath the substrate support 222 by reducing and/or preventing the flow of material precursor gases thereinto.

The substrate support assembly 220 includes the movable support shaft 262 that sealingly extends through the chamber base 214, such as being surrounded by a bellows 265 in the region below the chamber base 214, and the substrate support 222, which is disposed on the movable support shaft 262. To facilitate substrate transfer to and from the substrate support 222, the substrate support assembly 220 includes a lift pin assembly 266 comprising a plurality of lift pins 267 coupled to or disposed in engagement with a lift pin hoop 268. The plurality of lift pins 267 are movably disposed in openings formed through the substrate support 222. When the substrate support 222 is disposed in a lowered substrate transfer position (not shown), the plurality of lift pins 267 extend above a substrate receiving surface of the substrate support 222 to lift a substrate 230 therefrom and provide access to a backside (non-active) surface of the substrate 230 by a substrate handler (not shown). When the substrate support 222 is in a raised or processing position (as shown), the plurality of lift pins 267 recede beneath the substrate receiving surface of the substrate support 222 to allow the substrate 230 to rest thereon.

The substrate 230 is transferred to and from the substrate support 222 through a door 271, for example, a slit-valve disposed in one of the one or more sidewalls 212. Here, one or more openings in a region surrounding the door 271, for example, openings in a door housing, are fluidly coupled to a purge gas source 237, for example, an argon gas source. The purge gas is used to prevent processing and cleaning gases from contacting and/or degrading a seal surrounding the door, thus extending the useful lifetime thereof.

The substrate support 222 is configured for vacuum chucking where the substrate 230 is secured to the substrate support 222 by applying a vacuum to an interface between the substrate 230 and the substrate receiving surface. The vacuum is applied use of a vacuum source 272 fluidly coupled to one or more channels or ports formed in the substrate receiving surface of the substrate support 222. In other embodiments, for example, where the processing chamber 202 is configured for direct plasma processing, the substrate support 222 may be configured for electrostatic chucking. In one embodiment which can be combined with other embodiments, the substrate support 222 includes one or more electrodes (not shown) coupled to a bias voltage power supply (not shown), such as a continuous wave (CW) RF power supply or a pulsed RF power supply, which supplies a bias voltage thereto.

As shown, the substrate support assembly 220 features a dual-zone temperature control system to provide independent temperature control within different regions of the substrate support 222. The different temperature-controlled regions of the substrate support 222 correspond to different regions of the substrate 230 disposed thereon. Here, the temperature control system includes a first heater 263 and a second heater 264. The first heater 263 is disposed in a central region of the substrate support 222, and the second heater 264 is disposed radially outward from the central region to surround the first heater 263. In other embodiments, the substrate support 222 may have a single heater or more than two heaters.

In one embodiment which can be combined with other embodiments, the substrate support assembly 220 further includes an annular shadow ring 235, which is used to prevent undesired material deposition on a circumferential bevel edge of the substrate 230. During substrate transfer to and from the substrate support 222, for example, when the substrate support assembly 220 is disposed in a lowered position (not shown), the shadow ring 235 rests on an annular ledge within the processing volume 215. When the substrate support assembly 220 is disposed in a raised or processing position, the radially outward surface of the substrate support 222 engages with the annular shadow ring 235 so that the shadow ring 235 circumscribes the substrate 230 disposed on the substrate support 222. Here, the shadow ring 235 is shaped so that a radially inward facing portion of the shadow ring 235 is disposed above the bevel edge of the substrate 230 when the substrate support assembly 220 is in the raised substrate processing position.

In one embodiment which can be combined with other embodiments, the substrate support assembly 220 further includes an annular purge ring 236 disposed on the substrate support 222 to circumscribe the substrate 230. In those embodiments, the shadow ring 235 may be disposed on the purge ring 236 when the substrate support assembly 220 is in the raised substrate processing position. Typically, the purge ring 236 features a plurality of radially inward facing openings that are in fluid communication with the purge gas source 237. During substrate processing, a purge gas flows into an annular region defined by the shadow ring 235, the purge ring 236, the substrate support 222, and the bevel edge of the substrate 230 to prevent processing gases from entering the annular region and causing undesired material deposition on the bevel edge of the substrate 230.

In one embodiment which can be combined with other embodiments, the processing chamber 202 is configured for direct plasma processing. In those embodiments, the showerhead 218 may be electrically coupled to a first power supply 231, such as an RF power supply, which supplies power to ignite and maintain a plasma of processing gases flowed into the processing region 221 through capacitive coupling therewith. In one embodiment which can be combined with other embodiments, the processing chamber 202 comprises an inductive plasma generator (not shown), and a plasma is formed through inductively coupling an RF power to the processing gas.

The processing system 200 is advantageously configured to perform each of the tungsten nucleation, nitrogen plasma inhibition treatment, and bulk tungsten deposition processes of a void-free and seam-free tungsten gapfill process scheme without removing the substrate 230 from the processing chamber 202. The gases used to perform the individual processes of the gapfill process scheme, and to clean residues from the interior surfaces of the processing chamber 202, are delivered to the processing chamber 202 using the gas delivery system 204 fluidly coupled thereto.

Generally, the gas delivery system 204 includes one or more remote plasma sources, here the first and second radical generator 206A-B, a deposition gas source 240, and a conduit system 294 (e.g., the plurality of conduits 294A-F) fluidly coupling the radical generators 206A-B and the deposition gas source 240 to the chamber lid assembly 210. The gas delivery system 204 further includes a plurality of isolation valves, here the first and second valves 290A-B, respectively disposed between the radical generators 206A-B and the lid plate 216, which may be used to fluidly isolate each of the radical generators 206A-B from the processing chamber 202 and from one another.

Each of the radical generators 206A-B features a chamber body 280 that defines the respective first and second plasma chamber volumes 281A-B as shown in FIG. 2B. Each of the radical generators 206A-B is coupled to a respective power supply 293A-B. The power supplies 293A-B are used to ignite and maintain a plasma 282A-B of gases delivered to the plasma chamber volumes 281A-B from a corresponding first or second gas source 287A-B fluidly coupled thereto. In one embodiment which can be combined with other embodiments, the first radical generator 206A generates radicals used in the nitrogen plasma inhibition treatment process. For example, the first radical generator 206A may be used to ignite and maintain a treatment plasma 282A from a non-halogen-containing gas mixture delivered to the first plasma chamber volume 281A from the first gas source 287A. The second radical generator 206B may be used to generate cleaning radicals used in a chamber clean process by igniting and maintaining a cleaning plasma 282B from a halogen-containing gas mixture delivered to the second plasma chamber volume 281B from the second gas source 287B.

Typically, nitrogen treatment radicals have a relativity short lifetime (when compared to halogen cleaning radicals) and may exhibit a relatively high sensitivity to recombination from collisions with surfaces in the gas delivery system 204 and/or with other species of the treatment plasma effluent. Thus, in one embodiment which can be combined with other embodiments, the first radical generator 206A is typically positioned closer to the gas inlet 223 than the second radical generator 206B, for example, to provide a relatively shorter travel distance from the first plasma chamber volume 281A to the processing region 221.

In one embodiment which can be combined with other embodiments, the first radical generator 206A is also fluidly coupled to the second gas source 287B, which delivers a halogen-containing conditioning gas to the first plasma chamber volume 281A to be used in a plasma source condition process. In those embodiments, the gas delivery system 204 may further include a plurality of diverter valves 291, which are operable to direct the halogen-containing gas mixture from the second gas source 287B to the first plasma chamber volume 281A.

Suitable remote plasma sources which may be used for one or both of the radical generators 206A-B include radio frequency (RF) or very high radio frequency (VHRF) capacitively coupled plasma (CCP) sources, inductively coupled plasma (ICP) sources, microwave-induced (MW) plasma sources, electron cyclotron resonance (ECR) chambers, or high-density plasma (HDP) chambers.

As shown, the first radical generator 206A is fluidly coupled to the processing chamber 202 by use of first and second conduits 294A-B, which extend upwardly from the gas inlet 223 to connect with an outlet of the first plasma chamber volume 281A. A first valve 290A, disposed between the first and second conduits 294A-B, is used to selectively fluidly isolate the first radical generator 206A from the processing chamber 202 and the other portions of the gas delivery system 204. Typically, the first valve 290A is closed during, for example, a chamber clean process to prevent activated cleaning gases, e.g., halogen radicals, from flowing into the first plasma chamber volume 281A and damaging the surfaces thereof.

The second radical generator 206B is fluidly coupled to the second conduit 294B, and thus the processing chamber 202, by use of third and fourth conduits 294C-D. The second radical generator 206B is selectively isolated from the processing chamber 202 and from the other portions of the gas delivery system 204 by use of a second valve 290B that is disposed between the third and fourth conduits 294C-D.

Deposition gases, for example, tungsten-containing precursors and reducing agents, are delivered from the deposition gas source 240 to the processing chamber 202 using a fifth conduit 294E. As shown, the fifth conduit 294E is coupled to the second conduit 294B at a location proximate to the gas inlet 223 so that the first and second valves 290A-B may be used to respectively isolate the first and second radical generators 206A-B from deposition gases introduced into the processing chamber 202. In one embodiment which can be combined with other embodiments, the gas delivery system 204 further includes a sixth conduit 294F which is coupled to the fourth conduit 294D at a location proximate to the second valve 290B. The sixth conduit 294F, is fluidly coupled to a bypass gas source 238, for example, an argon (Ar) gas source, which may be used to periodically purge portions of the gas delivery system 204 of undesired residual cleaning, inhibition, and/or deposition gases.

The processing system 200 described above may be used to perform each of the nucleation of operation 340, the nitrogen plasma inhibition treatment of operation 350, and the tungsten gapfill deposition operations 360-380, thus providing a single-chamber seam-free tungsten gapfill solution.

Figure 3A:
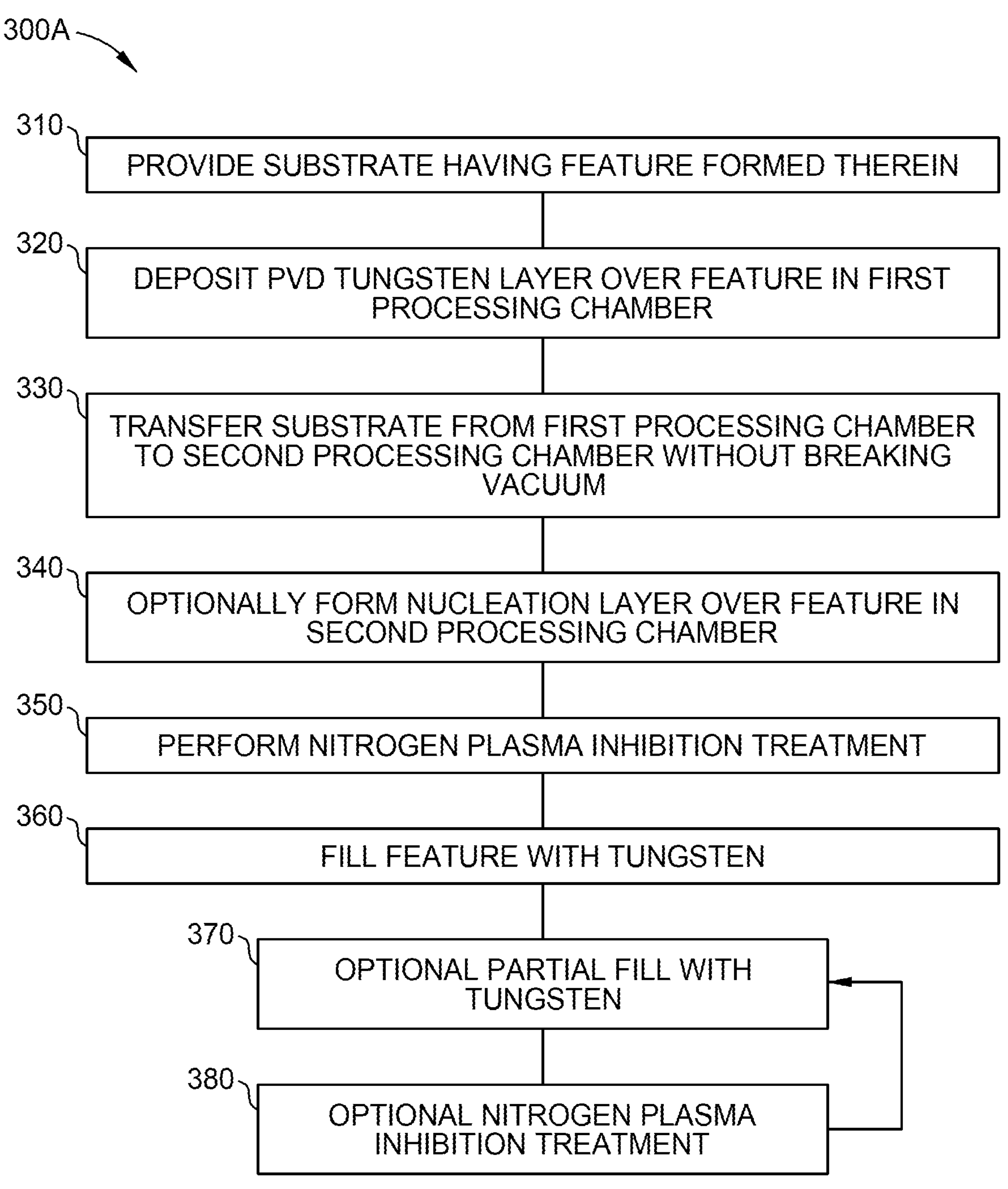
FIGS. 3A-3C illustrate flow charts of a method for manufacturing a semiconductor device in accordance with one or more embodiments of the present disclosure.
Figures 3B, 3C:
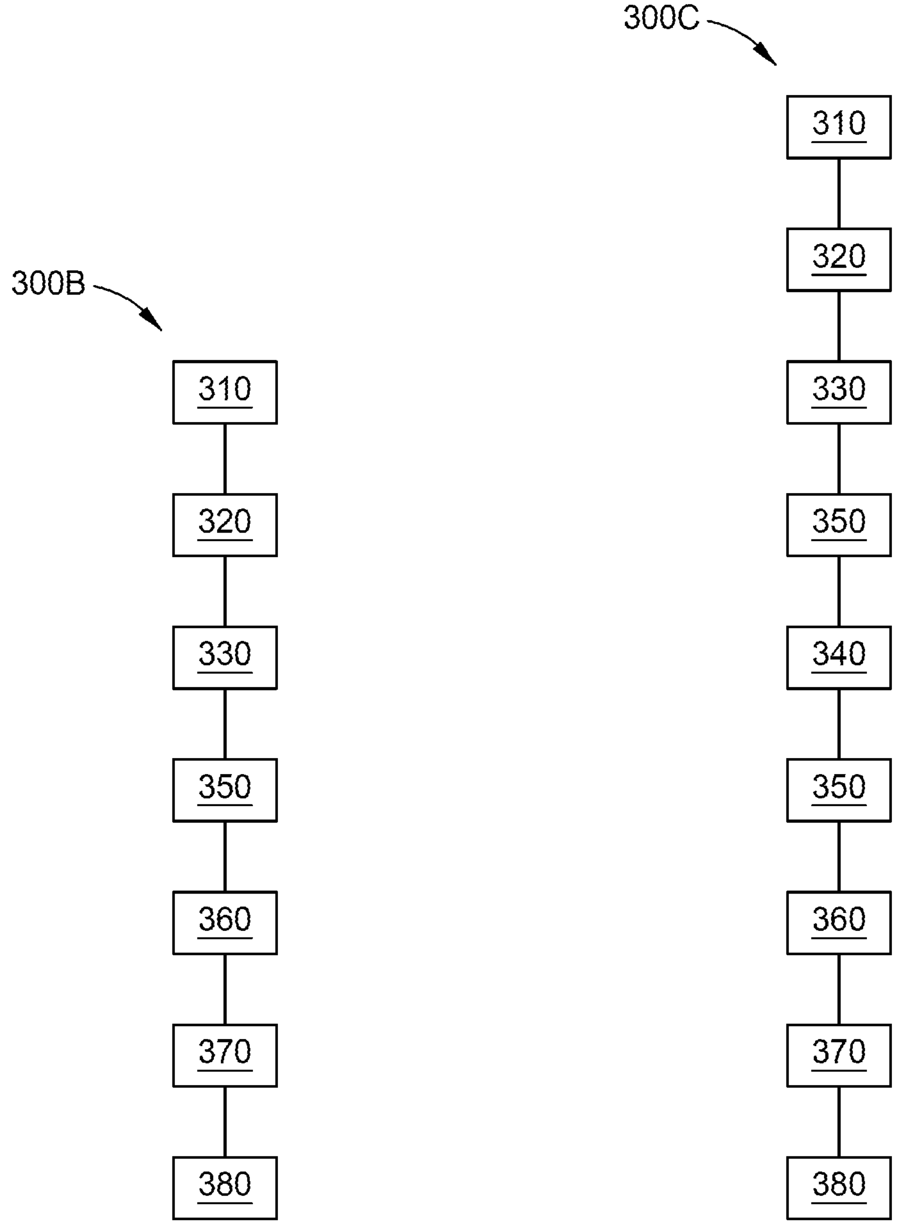

FIGS. 3A-C illustrates flow charts of various methods 300A-C for manufacturing a semiconductor device in accordance with one or more embodiments of the present disclosure. FIGS. 4A-4H illustrate views of various stages of manufacturing a semiconductor device in accordance with one or more embodiments of the present disclosure. Although FIGS. 4A-4H are described in relation to the method 300A-C, it will be appreciated that the structure disclosed in FIGS. 4A-4H are not limited to the methods 300A-C, but instead may stand alone as structures independent of the methods 300A-C. Similarly, although the methods 300A-C are described in relation to FIGS. 4A-4H, it will be appreciated that the methods 300A-C are not limited to the structures disclosed in FIGS. 4A-4H, but instead may stand alone independent of the structures disclosed in FIGS. 4A-4H.

Figure 4A:
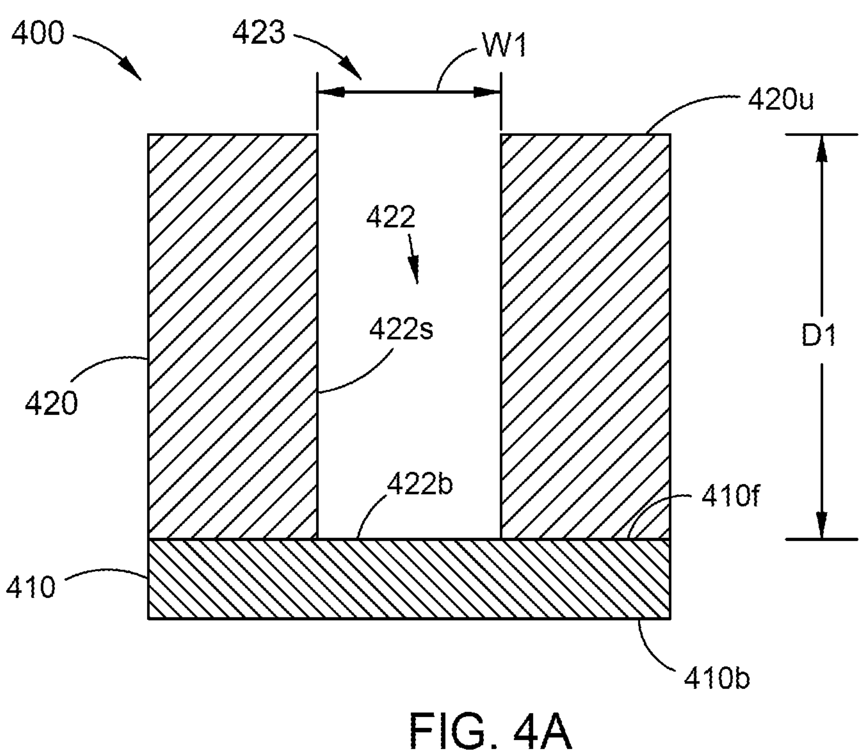
FIGS. 4A-4H illustrate views of various stages of manufacturing a semiconductor device in accordance with one or more embodiments of the present disclosure.

Referring to the method 300A, at operation 310, a substrate having a feature formed therein is provided. Referring to FIG. 4A, the substrate may be a semiconductor device structure 400 including a device substrate 410 having one or more layers formed thereon, for example, a dielectric layer 420, is provided. The device substrate 410 may be or include a bulk semiconductor substrate, a semiconductor-on-insulator (SOI) substrate, or the like, which may be doped (e.g., with a p-type dopant or an n-type dopant) or undoped. In one embodiment which can be combined with other embodiments, the semiconductor material of the device substrate 410 may include an elemental semiconductor, for example, such as silicon (Si) or germanium (Ge); a compound semiconductor including, for example, silicon carbide, gallium arsenide, gallium phosphide, indium phosphide, indium arsenide, and/or indium antimonide; an alloy semiconductor including, for example, SiGe, GaAsP, AlInAs, GaInAs, GaInP, and/or GaInAsP; a combination thereof, or the like. The device substrate 410 may include additional materials, for example, silicide layers, metal silicide layers, metal layers, dielectric layers, etch stop layers, interlayer dielectrics, or a combination thereof.

The device substrate 410 may further include integrated circuit devices (not shown). As one of ordinary skill in the art will recognize, a wide variety of integrated circuit devices such as transistors, diodes, capacitors, resistors, the like, or combinations thereof may be formed in and/or on the device substrate 410 to generate the structural and functional requirements of the design for the resulting semiconductor device structure 400.

The device substrate 410 has a frontside **410*f* (also referred to as a front surface) and a backside 410*b* (also referred to as a back surface) opposite the frontside 410*f*. The dielectric layer 420 is formed over the frontside 410*f* of the device substrate 410. The dielectric layer 420 may include multiple layers. The dielectric layer 420 includes an upper surface 420*u* or field region. In one embodiment which can be combined with other embodiments, the dielectric layer 420 includes silicon oxide, silicon oxynitride, silicon nitride, a combination thereof, or multi-layers thereof. In one embodiment which can be combined with other embodiments, the dielectric layer 420** consists essentially of silicon oxide. It is noted that the foregoing descriptors (e.g., silicon oxide) should not be interpreted to disclose any particular stoichiometric ratio. Accordingly, "silicon oxide" and the like will be understood by one skilled in the art as a material consisting essentially of silicon and oxygen without disclosing any specific stoichiometric ratio.

The dielectric layer 420 is patterned to form one or more feature(s) 422. In one embodiment which can be combined with other embodiments, the feature 422 can be selected from a trench, a via, a hole, or a combination thereof. In particular embodiments, the feature 422 is a via. In one embodiment which can be combined with other embodiments, the feature 422 extends from the upper surface **420*u* of the dielectric layer 420 to the frontside 410*f* of the device substrate 410. The feature 422 includes sidewall surface 422*s* and a bottom surface 422*b* extending between the sidewall surface 422*s*. In one embodiment which can be combined with other embodiments, the sidewall surface 422*s* are tapered. The sidewall surface 422*s* may be defined by the dielectric layer 420 and the bottom surface may be defined by the device substrate 410. In one embodiment which can be combined with other embodiments, the sidewall surface 422*s* may be defined by the dielectric layer 420 and the bottom surface may also be defined by the dielectric layer 420. The feature 422 has a first depth "D1" from the upper surface 420*u* to the bottom surface 422*b* and a width "W1" between the two sidewall surface 422*s*. In one embodiment which can be combined with other embodiments, the depth D1 is in a range of 2 nm to 200 nm, 3 nm to 200 nm, 5 nm to 100 nm, 2 nm to 100 nm, or 50 nm to 100 nm. In one embodiment which can be combined with other embodiments, the width W1 is in a range of 10 nm to 100 nm, 10 nm to 20 nm, 10 nm to 50 nm, or 50 nm to 100 nm. In one embodiment which can be combined with other embodiments, the feature 422** has an aspect ratio (D/W) in a range of 1 to 20, 5 to 20, 10 to 20, or 15 to 20.

The substrate may be transferred into the processing region of a first processing chamber, for example, any of the substrate processing chambers 112, 114, 116, 118, 132, 134, 135, 136, and 138 on the processing system 100. The first processing chamber may be a PVD chamber configured to deposit a tungsten liner.

At operation 320 a tungsten layer, for example, a tungsten liner 430, is formed over the surfaces of the feature, for example, the surfaces of the feature 422, via a PVD process in a first processing chamber. The tungsten liner may function as one of an adhesion layer, a seed layer, and/or a liner layer. The tungsten liner 430 may be a conformal layer or a nonconformal layer.

Figure 4B:
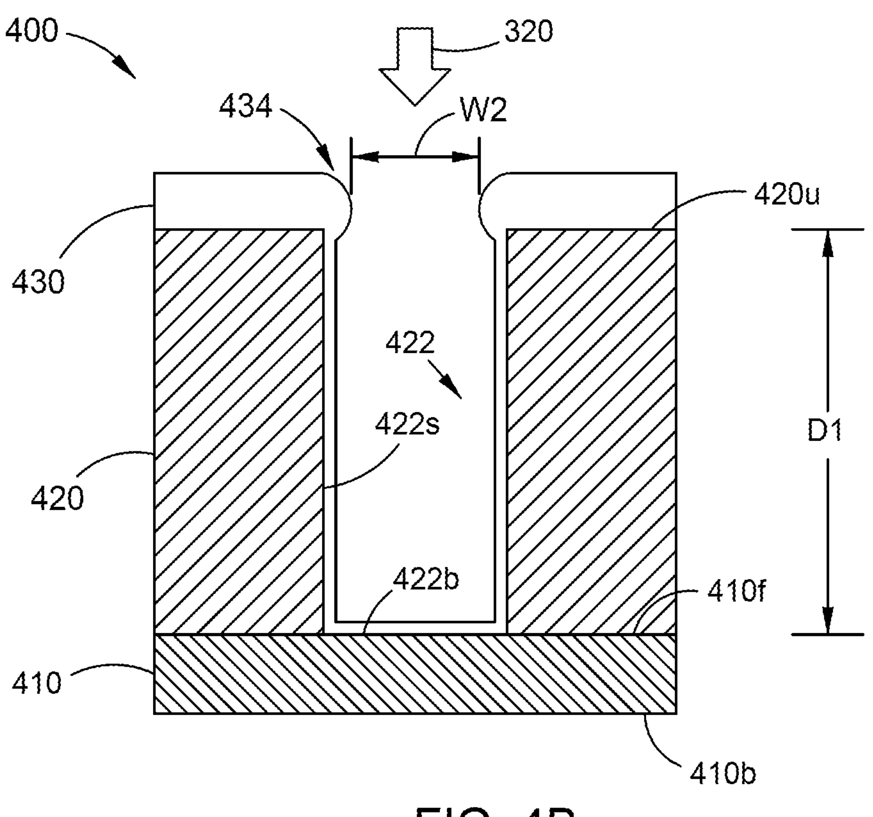

Referring to FIG. 4B, the tungsten liner 430 may be formed over the sidewall surface 422*s* and the bottom surface 422*b* of the feature 422 and on the upper surface 420*u* or field region of the dielectric layer 420. The tungsten liner 430 may have an initial thickness in a range from about 1 Å to about 100 Å, or in a range from about 20 Å to about 80 Å, or in a range from about 50 Å to about 60 Å. In one embodiment which can be combined with other embodiments, the tungsten liner 430 may be discontinuous along for example, the sidewall surface 422*s* and/or the bottom surface 422*b*. In one embodiment which can be combined with other embodiments, as depicted in FIG. 4B, the tungsten liner 430 may grow faster near a top opening 423 of the feature 422 creating an overhang portion 434 along the upper surface 420*u* and/or the field region of the dielectric layer 420. The overhang portion 434 may partially obstruct or block the top opening of the feature 422. The overhang portion 434 may reduce the width of the top opening from W1 as shown in FIG. 4A to W2 as shown in FIG. 4B.

At operation 330, the substrate is transferred from the first processing chamber to a second processing chamber without breaking vacuum. The second processing chamber may be used to perform the bottom-up tungsten gapfill substrate processing methods described herein. The second processing chamber may be the processing system 200 shown in FIGS. 2A-2B. Here, the processing system 200 is configured to provide the different processing conditions desired for each of the optional nucleation process of operation 340, the nitrogen plasma inhibition treatment process of operation 350, and the selective gapfill process of operation 360 within a single processing chamber 202, without transferring the substrate between a plurality of processing chambers. The second processing chamber may be positioned on the multi-chamber processing system 100 shown in FIG. 1. The second processing chamber may be one of the first set of one or more substrate processing chambers 112, 114, 116, 118 and/or one of the second set of one or more processing chambers 132, 134, 135, 136, and 138.

The substrate may be transferred from the first processing chamber to the second processing chamber under vacuum conditions without breaking vacuum via, for example, the first transfer robot 110 in the first transfer chamber 111 and/or the second transfer robot 130 in the second transfer chamber 131 depending upon the location of the first processing chamber and the second processing chamber.

Figure 4C:
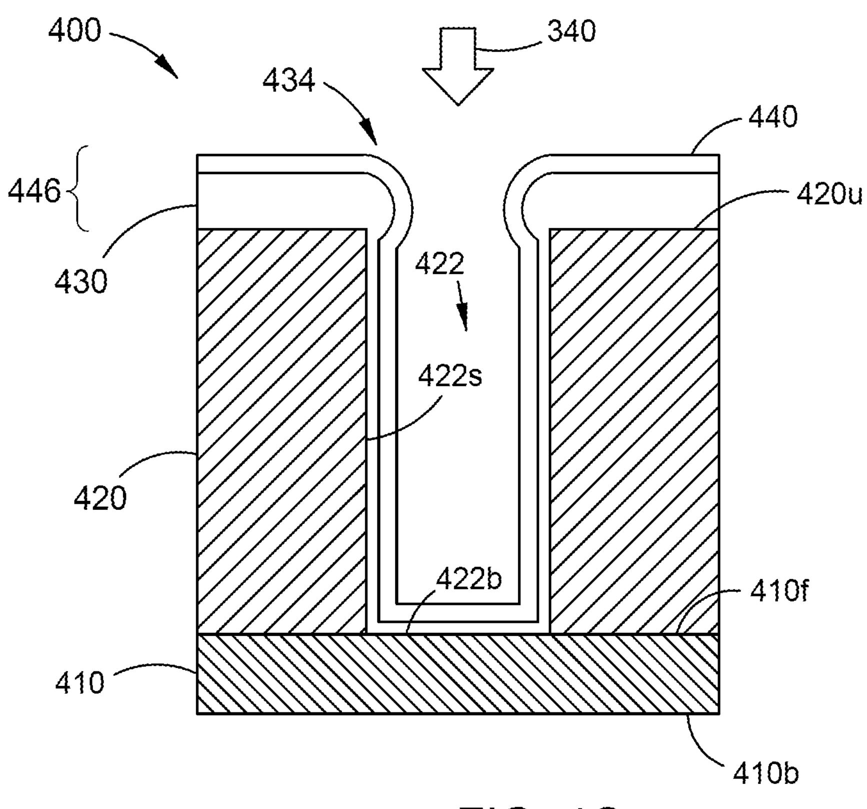

At operation 340, optionally, a nucleation layer, for example, the nucleation layer 440, is formed over the feature, for example, the feature 422 in the second processing chamber. Referring to FIG. 4C, the nucleation layer 440 may be formed over the surfaces of the feature 422, for example, over the surface of the tungsten liner 430. The nucleation layer 440 may function as a seed layer for subsequent deposition of the metal-fill material. In addition, in one embodiment which can be combined with other embodiments where the previously deposited tungsten liner 430 is discontinuous, for example, along the sidewall surface 422*s*, the nucleation layer 440 may repair discontinuous portions of the tungsten liner 430. The nucleation layer 440 may include or be any suitable material for facilitating the growth of the subsequently deposited metal-fill material. The nucleation layer 440 can include or be a metal, a metal-boride, for example, tungsten-boride (BW), or the like. The nucleation layer 440 may be formed by any suitable process for forming a tungsten-containing nucleation layer. Any suitable nucleation layer deposition process such as ALD, CVD, a cyclic chemical vapor deposition (CCVD) process, or a hybrid ALD/CVD process may be used to form the tungsten-containing nucleation layer. In one example, one cycle of the ALD process includes a boron pulse/a boron purge/a tungsten pulse/a tungsten purge. The ALD process may be repeated for any number of cycles sufficient to deposit a nucleation layer of targeted thickness. In one example, the ALD cycle is repeated for 3 to 5 cycles.

In one embodiment which can be combined with other embodiments, the nucleation layer 440 may include or be a tungsten-containing nucleation layer, for example, a boron-tungsten (BW) nucleation layer, a boron-silicon-tungsten (BSW) nucleation layer, or a silicon-tungsten (SW) nucleation layer. The nucleation layer 440 may be a conformal layer. In one embodiment which can be combined with other embodiments, the tungsten liner 430 has the nucleation layer 440 formed thereon, for example, a tungsten liner layer having a boron-tungsten nucleation layer formed thereon. In one embodiment which can be combined with other embodiments, the tungsten liner 430 and the nucleation layer 440 may be referred to individually or together as tungsten-containing layers or the underlying layers 446 as depicted in FIG. 4C.

In one embodiment which can be combined with other embodiments, forming the nucleation layer 440 at operation 340 includes exposing the semiconductor device structure 400 to a tungsten-containing precursor gas at a first precursor gas flow rate followed by exposing the semiconductor device structure 400 to a reducing agent. The reducing agent may include boron and is introduced to the processing region 221 at a reducing agent flow rate. The tungsten-containing precursor gas and the reducing agent may be alternated cyclically to form the nucleation layer 440 over the semiconductor device structure 400 within the feature 422 at the reducing agent flow rate. The reducing agent and the tungsten-containing precursor gas may be cyclically alternated, beginning with either the reducing agent or the tungsten-containing precursor gas, and ending with the same beginning gas or ending with a gas different from the beginning gas. In one embodiment which can be combined with other embodiments, the reducing agent or the tungsten-containing precursor gas are cyclically alternated beginning with the tungsten-containing precursor gas and ending in the reducing agent.

In one embodiment which can be combined with other embodiments, the nucleation layer 440 is deposited using the ALD process. The ALD process includes repeating cycles of alternately exposing the feature 422 to a tungsten-containing precursor and exposing the feature 422 to a reducing agent. In one embodiment which can be combined with other embodiments, the processing region 221 is purged between the alternating exposures. In one embodiment which can be combined with other embodiments, the processing region 221 is continuously purged. Examples of suitable tungsten-containing precursors include tungsten halides, such as tungsten hexafluoride ($WF_6$), tungsten hexachloride ($WCl_6$), or a combination thereof. In one embodiment which can be combined with other embodiments, the tungsten-containing precursor includes $WF_6$, and the reducing agent includes a boron-containing agent, such as $B_2H_6$.

In one embodiment which can be combined with other embodiments, the semiconductor device structure 400 may be heated prior to or during the nucleation deposition process of operation 340. In one embodiment which can be combined with other embodiments, the substrate may be heated at a temperature from about 250 to about 550 degrees Celsius, or in a range from about 350 to about 450 degrees Celsius. In one embodiment which can be combined with other embodiments, during the nucleation layer deposition process of operation 340, the processing region 221 is maintained at a pressure of less than about 120 Torr, such as in a range from about 900 mTorr to about 120 Torr, in a range from about 1 Torr to about 100 Torr, or for example, in a range from about 1 Torr to about 50 Torr. Exposing the semiconductor device structure 400 to the tungsten-containing precursor includes flowing the tungsten-containing precursor into the processing region 221 at a flow rate of about 100 sccm or less, such as in a range from about 10 sccm to about 60 sccm, or in a range from about 20 sccm to about 80 sccm. Exposing the semiconductor device structure 400 to the reducing agent includes flowing the reducing agent into the processing region 221 at a flow rate in a range from about 200 sccm to about 1000 sccm, such as in a range from about 300 sccm to about 750 sccm. It should be noted that the flow rates for the various deposition and treatment processes described herein are for a processing system configured to process a 300-mm diameter substrate. Appropriate scaling may be used for processing systems configured to process different-sized substrates.

In one embodiment which can be combined with other embodiments, the tungsten-containing precursor and the reducing agent are each flowed into the processing region 221 for a duration in a range from about 0.1 seconds to about 10 seconds, such as in a range from about 0.5 seconds to about 5 seconds. The processing region 221 may be purged between the alternating exposures by flowing a purge gas, such as argon (Ar) or hydrogen gas, into the processing region 221 for a duration in a range from about 0.1 seconds to about 10 seconds, such as in a range from about 0.5 seconds to about 5 seconds. Typically, the repeating cycles of the nucleation process continue until the nucleation layer 440 has a thickness in a range from about 10 Å to about 200 Å, such as in a range from about 10 Å to about 150 Å, or in a range from about 20 Å to about 150 Å. The nucleation layer 440 is disposed along sidewall surface **422*s* and or the bottom surfaces 422*b* of the feature 422, such as over the tungsten liner 430. The nucleation layer 440 may also contribute to the thickness of the overhang portion 434 formed by the tungsten layer during operation 320**.

In one embodiment which can be combined with other embodiments where operation 340 is performed, the second processing is purged prior to proceeding to operation 350.

Figure 4D:
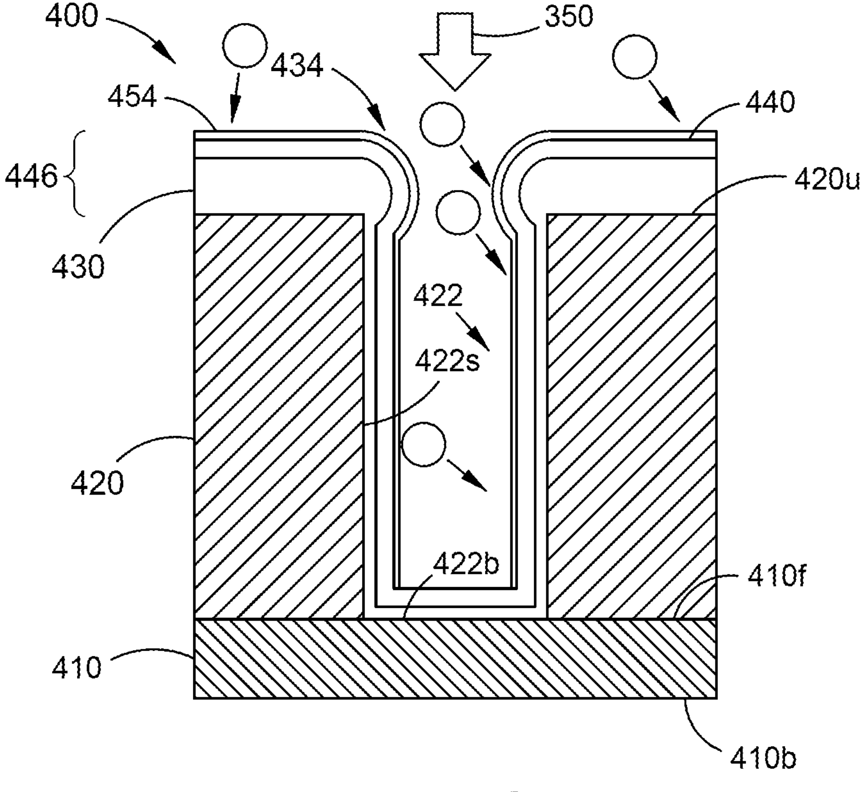

At operation 350, the substrate is exposed to a nitrogen plasma inhibition treatment. Referring to FIG. 4D, the nitrogen plasma inhibition treatment process of operation 350 utilizes ion and/or radical based nitrogen plasma to achieve conformal treatment by forming a nitrogen passivation layer 454 along the upper surface **420*u* or field region, the overhang portion 434, and inside the feature 422 along the sidewall surface 422*s* while leaving the bottom surface 422*b* substantially uncoated. In one embodiment which can be combined with other embodiments, as shown in FIG. 4D, the passivation layer 454 coats the nucleation layer 440. The nitrogen passivation layer 454 suppresses growth of the subsequently deposited metal-fill material along the passivated regions (e.g., the upper surface 420*u*, the overhang portion 434, and/or the sidewall surface 422*s* while enabling bottom-up growth from the nucleation layer 440 or tungsten liner 430 (if the nucleation layer 440 is not present) formed over the bottom surface 422*b*. The passivation layer 454 may be partially formed along the length of the sidewall surface 422*s*, which corresponds to the depth "D1**".

In one embodiment which can be combined with other embodiments, the nitrogen plasma inhibition treatment process of operation 350 may include exposing a portion of the underlying layers (e.g., the one or the tungsten liner 430 and/or the nucleation layer 440) to a nitrogen plasma inhibition treatment process. During operation 350, the substrate is exposed to an activated species of a process gas, for example, the nitrogen treatment radicals from a remote plasma source. Suitable process gases that may be used for the nitrogen plasma inhibition process include $N_2$, $H_2$, $NH_3$, $NH_4$, $O_2$, $CH_4$, NO, $NO_2$, $N_2H_4$, $NF_3$, or a combination thereof. In one embodiment which can be combined with other embodiments, the process gas includes nitrogen, for example, $N_2$, $N_2/H_2$, $NH_3$, $NH_4$, NO, $NO_2$, $N_2H_4$, $NF_3$, or a combination thereof and the activated species include nitrogen radicals, for example, atomic nitrogen. The process gas may further include an inert gas, for example, argon (Ar), helium (He), krypton (Kr), or a combination thereof. In particular embodiments, the process gas includes argon (Ar) and nitrogen ($N_2$).

In one embodiment which can be combined with other embodiments the nitrogen plasma inhibition treatment process is an inductively coupled plasma process. In one embodiment which can be combined with other embodiments, the nitrogen plasma inhibition treatment process is a capacitively coupled plasma process. In one embodiment which can be combined with other embodiments, the nitrogen plasma is formed in a remote plasma source (RPS). In one embodiment which can be combined with other embodiments, the nitrogen plasma is generated within the processing region 221 (e.g., a direct plasma). In one embodiment which can be combined with other embodiments, the nitrogen plasma inhibition treatment process includes exposing the underlying layers 246 to a plasma formed from the process gas including a nitrogen-containing gas. In one embodiment which can be combined with other embodiments, the plasma treatment process includes exposing the nucleation layer to radicals from an ICP plasma formed from a process gas including a nitrogen-containing gas (e.g., $N_2$) and an inert gas (e.g., Ar). In one embodiment which can be combined with other embodiments, the plasma treatment process can include exposing the underlying layers to a plasma formed in an RPS form a process gas including one or more of $N_2$ and Ar. In one embodiment which can be combined with other embodiments, the nitrogen plasma inhibition treatment process can include exposing the nucleation layer to a plasma including either substantially radicals (nitrogen radicals) or substantially ions (nitrogen ions).

Without intending to be bound by theory, it is believed that the activated nitrogen species formed during the treatment with radicals are incorporated into portions of the nucleation layer 440 (if present) or into portions of the tungsten liner 430 (if the nucleation layer 440 is not present) by adsorption of the activated nitrogen species and/or by reaction with the metallic tungsten of the nucleation layer 440 or the tungsten liner 430 to form a tungsten nitride (WN) surface referred to as the nitrogen passivation layer 454. The adsorbed nitrogen and/or nitrided surface of the tungsten liner 430 or the nucleation layer 440 desirably delays (inhibits) further tungsten nucleation and thus subsequent tungsten deposition thereon.

Referring to FIGS. 2A-2B, in one embodiment which can be combined with other embodiments, exposing the underlying layers 446 to the treatment radicals includes forming a treatment plasma 282A of a substantially halogen-free treatment gas mixture using the first radical generator 206A and flowing the effluent of the treatment plasma 282A into the processing region 221. In one embodiment which can be combined with other embodiments, a flow rate of the treatment gas mixture into the first radical generator 206A, and thus the flow rate of the treatment plasma effluent, such as nitrogen gas, into the processing region 221, is about 1 sccm and about 3000 sccm, such as about 1 sccm and about 2500 sccm, such as about 1 sccm and about 2000 sccm, such as about 1 sccm and about 1000 sccm, such as about 1 sccm and about 500 sccm, such as about 1 sccm and about 300 sccm, such as about 1 sccm and about 100 sccm, such as about 1 sccm and about 75 sccm, such as about 1 sccm and about 50 sccm.

In one embodiment which can be combined with other embodiments, the inhibition treatment process includes exposing the semiconductor device structure 400 to the treatment radicals for a period of about 2 seconds or more, such as about 2 seconds to about 30 seconds, such as about 5 seconds to about 20 seconds, such as about 5 seconds to about 10 seconds.

In one embodiment which can be combined with other embodiments, a concentration of the substantially halogen-free treatment gas in the process gas mixture is about 0.1 vol. % to about 50 vol. %, such as about 0.2 vol. % to about 40 vol. %, about 0.2 vol. % to about 30 vol. %, about 0.2 vol. % and about 20 vol. %, or, for example, such as about 0.2 vol. % and about 10 vol. %, such as about 0.2 vol. % and about 5 vol. %. The remainder of the process gas mixture may be an inert gas. The inert gas may be, for example, argon (Ar), helium (He), krypton (Kr), or the like. In one embodiment which can be combined with other embodiments, the process gas includes nitrogen ($N_2$) and argon (Ar). In one embodiment which can be combined with other embodiments, the process gas consists only of nitrogen ($N_2$) and argon (Ar). In one embodiment which can be combined with other embodiments, the process gas may be predominantly comprised of or may consist essentially of nitrogen ($N_2$) and argon (Ar).

Referring to FIGS. 2A-2B, in other embodiments, the treatment radicals may be formed using a remote plasma source (not shown) which is ignited and maintained separate from the processing region 221 by the showerhead 218, such as between the showerhead 218 and the lid plate 216. In those embodiments, the activated treatment gas may be flowed through an ion filter to remove substantially all ions therefrom before the treatment radicals reach the processing region 221 and the surface of the semiconductor device structure 400. In one embodiment which can be combined with other embodiments, the showerhead 218 may be used as the ion filter. In other embodiments, a plasma used to form the treatment radicals is an in-situ plasma formed in the processing region 221 between the showerhead 218 and the semiconductor device structure 400. In one embodiment which can be combined with other embodiments, for example, when using an in-situ treatment plasma, the semiconductor device structure 400 may be biased to control the directionality and/or accelerate ions formed from the treatment gas, for example, charged treatment radicals, towards the substrate surface. In other embodiments, the semiconductor device structure 400 is exposed to the activated species without biasing the semiconductor device structure 400 in a bias-free process.

In one embodiment which can be combined with other embodiments, the semiconductor device structure 400 may be heated prior to or during the nitrogen plasma inhibition treatment process of operation 350. For example, heating the semiconductor device structure 400 at a temperature of at least about 250 degrees Celsius, or at least about 350 degrees Celsius may facilitate the efficacy of the nitrogen plasma inhibition treatment of the underlying layers 246. In one embodiment which can be combined with other embodiments, the substrate may be heated at a temperature from about 250 to about 550 degrees Celsius, or in a range from about 350 to about 450 degrees Celsius. The actual maximum substrate temperature may vary based upon hardware limitations and/or the thermal budget of the substrate being processed.

In one embodiment which can be combined with other embodiments, the inhibition treatment process includes maintaining the processing region 221 at a pressure of less than about 100 Torr while flowing the activated treatment gas thereinto. For example, during the inhibition treatment process, the processing region 221 may be maintained at a pressure of about 20 Torr or less, or in a range from about 100 mTorr to about 10 Torr, or in a range from about 0.5 Torr to about 10 Torr, or in a range from about 0.5 Torr to about 5 Torr, or in a range from about 1 Torr to about 5 Torr.

Figure 4E:
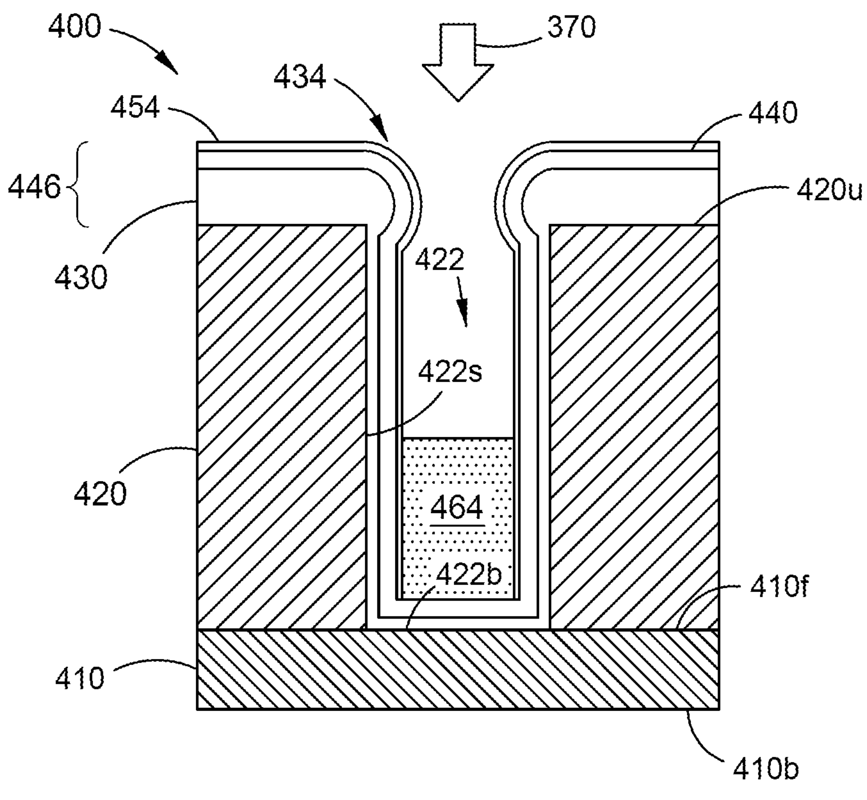

At operation 360, a tungsten gap-fill material 464 is optionally deposited via a bottom-up metal fill process, at least partially, into the feature 422 as shown in FIG. 4E. In one embodiment which can be combined with other embodiments, the bottom-up tungsten fill process may completely fill the feature 422 as is shown in FIG. 4G.

Figure 4F:
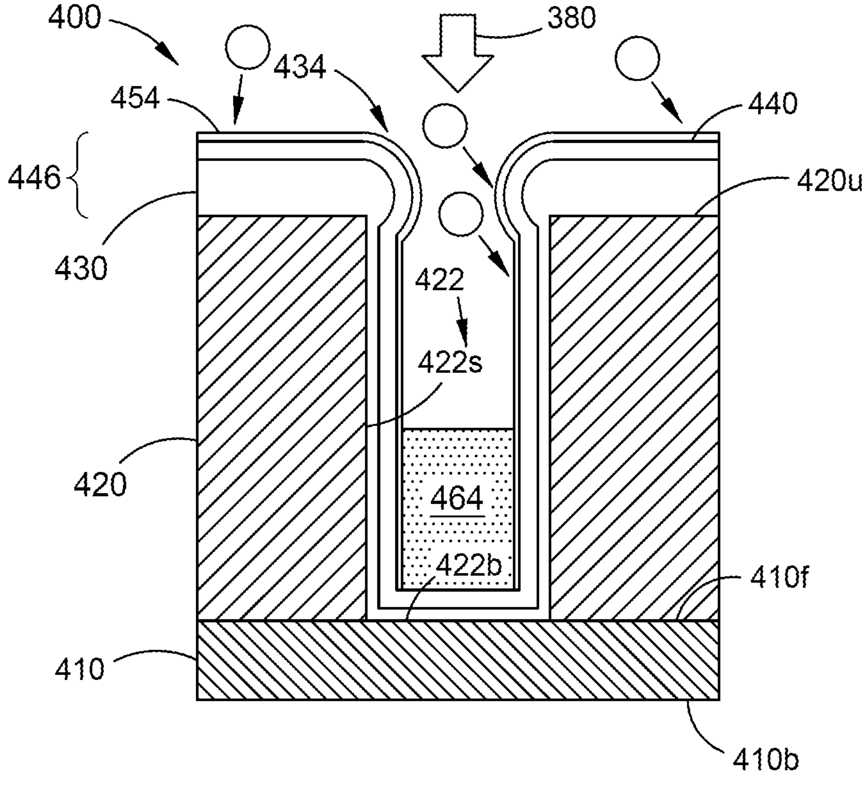
Figure 4G:
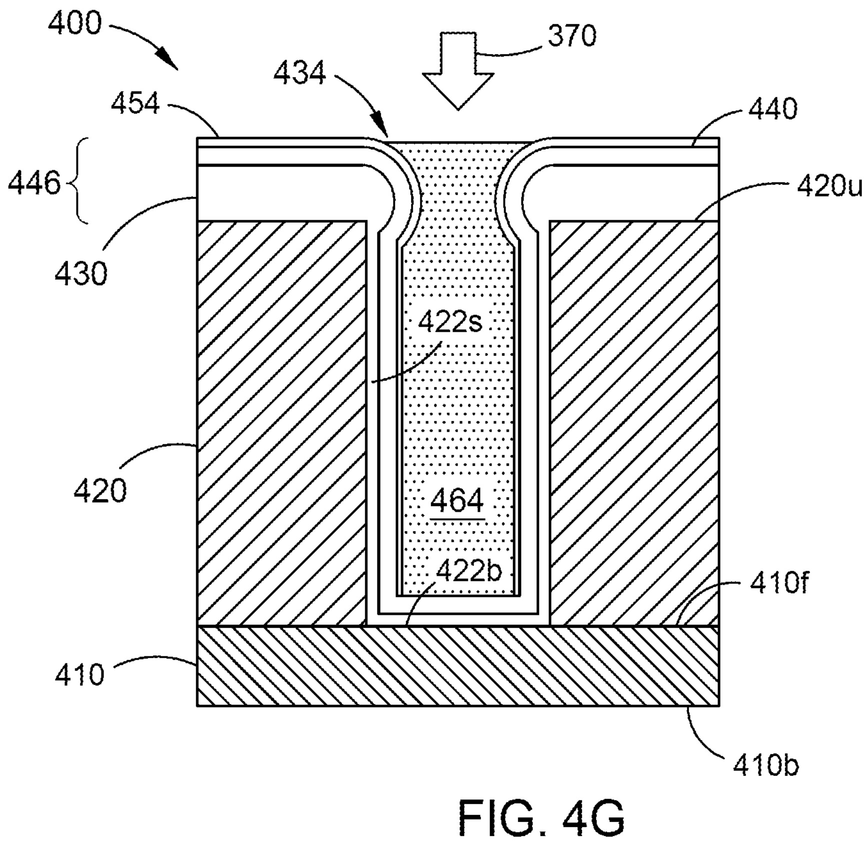

In other embodiments, the bottom-up metal fill process may partially fill the feature 422 at operation 370 followed as shown in FIG. 4E by a nitrogen plasma inhibition treatment process at operation 380 as shown in FIG. 4F. The nitrogen plasma inhibition treatment process at operation 380 may be performed similarly to the nitrogen plasma inhibition treatment process of operation 350. In one embodiment which can be combined with other embodiments, the nitrogen passivation layer 454 formed during operation 350 may dissipate after a certain amount of time. The nitrogen plasma inhibition treatment process at operation 380 reforms the nitrogen passivation layer 454 on exposed surfaces over the sidewall surfaces 422*s*, the overhang portion 434, and the upper surface 420*u* or field region as shown in FIG. 4E. Reforming the nitrogen passivation layer at operation 380 enables bottom-up tungsten fill to continue with the tungsten gap-fill material 464. Operation 370 and operation 380 may be repeated until the feature 422 is filled to a targeted level as is shown in FIG. 4G.

In one embodiment which can be combined with other embodiments, the tungsten gap-fill material 464 is formed using a CVD process including concurrently flowing (co-flowing) a tungsten-containing precursor gas, and a reducing agent into the processing region and exposing the semiconductor device structure 400 thereto. The tungsten-containing precursor and the reducing agent used for the tungsten gap-fill CVD process may include any combination of the tungsten-containing precursors and reducing agents described herein. In one embodiment which can be combined with other embodiments, the tungsten-containing precursor includes $WF_6$, and the reducing agent includes hydrogen gas. In one embodiment which can be combined with other embodiments, the tungsten gap-fill material 464 partially fills the features 422.

In one embodiment which can be combined with other embodiments, the tungsten-containing precursor is flowed into the processing region 221 at a flow rate in a range from about 10 sccm to about 1200 sccm, or more than about 50 sccm, or less than about 1000 sccm, or in a range from about 100 sccm to about 900 sccm. The reducing agent is flowed into the processing region 221 at a rate of more than about 500 sccm, such as more than about 750 sccm, more than about 1000 sccm, or in a range from about 500 sccm and about 10000 sccm, such as in a range from about 1000 sccm to about 9000 sccm, or in a range from about 1000 sccm and about 8000 sccm.

In one embodiment which can be combined with other embodiments, the tungsten gap-fill CVD process conditions are selected to provide a tungsten feature having a relativity low residual film stress when compared to conventional tungsten CVD processes. For example, In one embodiment which can be combined with other embodiments, the tungsten gap-fill CVD process includes heating the substrate at a temperature of about 250° C. or more, such as about 300° C. or more, or in a range from about 250° C. to about 500° C., or in a range from about 350 to about 450 degrees Celsius. During the CVD process, the processing region 221 may be maintained at a pressure of less than about 500 Torr, less than about 600 Torr, less than about 500 Torr, less than about 400 Torr, or in a range from about 1 Torr to about 500 Torr, such as in a range from about 1 Torr to about 450 Torr, or in a range from about 1 Torr to about 400 Torr, or for example, in a range from about 1 Torr and about 300 Torr.

In one embodiment which can be combined with other embodiments, operation 350 is performed at a low pressure in a range from about 0.1 mTorr to about 5 Torr and operation 360 is performed at a higher pressure in a range from about 10 Torr to about 300 Torr.

In another embodiment, the tungsten gap-fill material 464 is deposited at operation 360 using an atomic layer deposition (ALD) process. The tungsten gap-fill ALD process includes repeating cycles of alternately exposing the semiconductor device structure 400 to a tungsten-containing precursor gas and a reducing agent and purging the processing region 221 between the alternating exposures.

The tungsten-containing precursor and the reducing agent are each flowed into the processing region 221 for a duration of between about 0.1 seconds and about 10 seconds, such as between about 0.5 seconds and about 5 seconds. The processing region 221 may be purged between the alternating exposures by flowing an inert purge gas, such as argon (Ar) or hydrogen, into the processing region 221 for a duration in a range from about 0.1 seconds to about 10 seconds, such as in a range from about 0.5 seconds to about 5 seconds.

In other embodiments, the tungsten gap-fill material 464 is deposited using a pulsed CVD method that includes repeating cycles of alternately exposing the semiconductor device structure 400 to a tungsten-containing precursor gas and a reducing gas without purging the processing region 221. The processing conditions for the tungsten gap-fill pulsed CVD method may be the same, substantially the same, or within the same ranges as those described above for the tungsten gap-fill ALD process.

After operation 380, the semiconductor device structure 400 may be exposed to additional processing. In one embodiment which can be combined with other embodiments, the additional processing includes a planarization process, for example a chemical mechanical polishing (CMP) process or an etchback process may be performed to remove excess portions or overburden of the conductive material (if present) on the upper surface 420*u* of the dielectric layer 420. After completing the planarization process, a top surface 484 of the tungsten gap-fill material 464 may be co-planar or level with the upper surface 420*u* of the dielectric layer and the top surfaces of the nucleation layer 440 and the tungsten liner 430 as is shown in FIG. 4H.

Figure 4H:
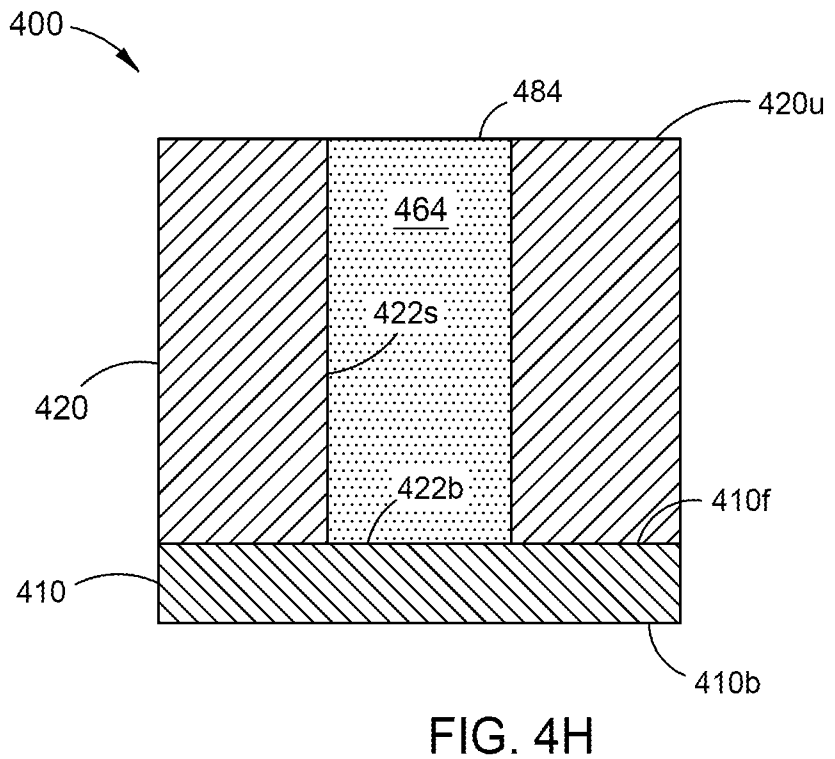

In one embodiment which can be combined with other embodiments, as is shown in FIG. 4H, the one or more tungsten layers 430, the nucleation layer 440, and the tungsten gap-fill material 464 are monolithic and do not have an interface therebetween. The tungsten gap-fill material 464, the tungsten liner 430, and/or the nucleation layer 440 together form a tungsten gap-fill layer or tungsten-containing layer.

Referring to FIG. 3B, the method 300B depicts another sequence of operations. The method 300B is similar to the method 300A, except that the method 300B omits the nucleation layer formed during operation 340. Thus, during the method 300B, the nitrogen plasma inhibition treatment process of operation 350 is performed directly on the tungsten liner layer formed during operation 330.

Referring to FIG. 3C, the method 300C depicts another sequence of operations. The method 300C is similar to the method 300A, except that the method 300C includes an additional nitrogen plasma inhibition treatment process of operation 350 performed after operation 330 and prior to operation 340. Thus, during the method 300C, the nitrogen plasma inhibition treatment process of operation 350 is performed directly on the tungsten liner layer formed during operation 330 and also directly on the nucleation layer formed during operation 340.

Embodiments can include one or more of the following potential advantages. Various embodiments described herein demonstrate an integrated solution for PVD tungsten liner followed by nitrogen plasma inhibition treatment process followed by CVD tungsten fill, which achieved a seamless via fill in very small structures, for example, a via size less than 15 nanometers. Various embodiments eliminate high resistivity layers, for example, TiN barriers, nucleation layers, and tungsten oxides formed during vacuum breaks. Elimination of these high resistivity layers improves device resistivity by about 30%. Further, the reduction of tungsten oxides contributes to a reduction in CMP defects. Various embodiments enable nitrogen plasma inhibition treatment to be performed directly on PVD tungsten liners which helps achieve seamless tungsten gapfill.

In the Summary and in the Detailed Description, and the claims, and in the accompanying drawings, reference is made to particular features (including method operations) of the present disclosure. It is to be understood that the disclosure in this specification includes all possible combinations of such particular features. For example, where a particular feature is disclosed in the context of a particular aspect or embodiment of the present disclosure, or a particular claim, that feature can also be used, to the extent possible in combination with and/or in the context of other particular aspects and embodiments of the present disclosure, and in the present disclosure generally.

When, in this specification, a range is given as "(a first number) to (a second number)" or "(a first number)-(a second number)," this means a range whose lower limit is the first number and whose upper limit is the second number. For example, 25 to 100 mm means a range whose lower limit is 25 mm, and whose upper limit is 100 mm.

Embodiments and all of the functional operations described in this specification can be implemented in digital electronic circuitry, or in computer software, firmware, or hardware, including the structural means disclosed in this specification and structural equivalents thereof, or in combinations of them. Embodiments described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

The term "comprises," "including," and "having" and grammatical equivalents thereof are used herein to mean that other components, ingredients, operations, etc. are optionally present. For example, an article "comprising" (or "which comprises") components A, B, and C can consist of (i.e., contain only) components A, B, and C, or can contain not only components A, B, and C but also one or more other components. In addition, whenever a composition, an element or a group of elements is preceded with the transitional phrase "comprising" or grammatical equivalents thereof, it is understood that it is contemplated that the same composition or group of elements may be preceded with transitional phrases "consisting essentially of," "consisting of," "selected from the group of consisting of," or "is" preceding the recitation of the composition, element, or elements and vice versa.

Where reference is made herein to a method comprising two or more defined operations, the defined operations can be carried out in any order or simultaneously (except where the context excludes that possibility), and the method can include one or more other operations which are carried out before any of the defined operations, between two of the defined operations, or after all of the defined operations (except where the context excludes that possibility).

When introducing elements of the present disclosure or exemplary aspects or embodiment(s) thereof, the articles "a," "an," "the" and "said" are intended to mean that there are one or more of the elements.

While the foregoing is directed to embodiments of the present disclosure, other and further embodiments of the disclosure may be devised without departing from the basic scope thereof, and the scope thereof is determined by the claims that follow.

The invention claimed is:

1. A method for processing a semiconductor device structure, comprising:

exposing at least one feature formed in a substrate to a physical vapor deposition (PVD) process to deposit a tungsten liner layer over the at least one feature, wherein the PVD process is performed in a first processing region of a first processing chamber and the at least one feature is defined by sidewall surfaces and a bottom surface extending between the sidewall surfaces;

transferring the substrate from the first processing region of the first processing chamber to a second processing region of a second processing chamber without breaking vacuum;

exposing the tungsten liner layer to nitrogen-containing radicals in the second processing region to passivate exposed portions of the tungsten liner layer, wherein the tungsten liner layer formed along the bottom surface remains substantially unpassivated; and exposing the at least one feature to a tungsten-containing precursor gas to form a tungsten fill layer over the tungsten liner layer within the at least one feature in the second processing region, comprising preferentially growing the tungsten fill layer from the tungsten liner layer formed along the bottom surface, wherein exposing the tungsten liner layer to the nitrogen-containing radicals forms a nitrogen passivation layer on the tungsten liner layer along the sidewall surfaces prior to initiating deposition of the tungsten fill layer, and wherein exposing the tungsten liner layer to the nitrogen-containing radicals is performed at a first pressure, and deposition of the tungsten fill layer is initiated at a second pressure that is higher than the first pressure.

2. The method of claim 1, wherein exposing the at least one feature to the tungsten-containing precursor gas to form the tungsten fill layer over the tungsten liner layer comprises a chemical vapor deposition (CVD) process.

3. The method of claim 1, wherein exposing the tungsten liner layer to the nitrogen-containing radicals in the second processing region comprises:

generating a plasma comprising the nitrogen-containing radicals in a remote plasma source (RPS), wherein the plasma is formed from a process gas comprising nitrogen and an inert gas; and flowing the nitrogen-containing radicals into the second processing region of the second processing chamber where the substrate is disposed.

4. The method of claim 3, further comprising flowing the plasma comprising the nitrogen-containing radicals through an ion filter to remove substantially all ions from the plasma prior to flowing the nitrogen-containing radicals into the second processing region.

5. The method of claim 4, wherein the process gas comprises from about 5% to about 20% nitrogen by volume, with the remainder being argon.

6. The method of claim 1, further comprising alternating exposing the tungsten liner layer to the nitrogen-containing radicals in the second processing region to passivate exposed portions of the tungsten liner layer and exposing the at least one feature to the tungsten-containing precursor gas to form the tungsten fill layer over the tungsten liner layer.

7. A method for processing a semiconductor device structure, comprising:

exposing at least one feature formed in a substrate to a physical vapor deposition (PVD) process to deposit a tungsten liner layer over the at least one feature, wherein the PVD process is performed in a first processing region of a first processing chamber and the at least one feature is defined by sidewall surfaces and a bottom surface extending between the sidewall surfaces;

transferring the substrate from the first processing region of the first processing chamber to a second processing region of a second processing chamber without breaking vacuum;

exposing the tungsten liner layer to a first tungsten-containing precursor and a reducing agent to form a boron-tungsten nucleation layer over the tungsten liner layer in the second processing region;

exposing the boron-tungsten nucleation layer to nitrogen-containing radicals in the second processing region to passivate exposed portions of the boron-tungsten nucleation layer; and exposing the at least one feature to a second tungsten-containing precursor gas to form a tungsten fill layer over the boron-tungsten nucleation layer within the at least one feature in the second processing region, wherein exposing the boron-tungsten nucleation layer to the nitrogen-containing radicals forms a nitrogen passivation layer on the boron-tungsten nucleation layer along the sidewall surfaces of the at least one feature prior to initiating deposition of the tungsten fill layer, and wherein exposing the boron-tungsten nucleation layer to the nitrogen-containing radicals is performed at a first pressure, and deposition of the tungsten fill layer is initiated at a second pressure that is higher than the first pressure.

8. The method of claim 7, wherein exposing the at least one feature to the second tungsten-containing precursor gas to form the tungsten fill layer over the tungsten liner layer comprises a chemical vapor deposition (CVD) process.

9. The method of claim 7, wherein exposing the boron-tungsten nucleation layer to the nitrogen-containing radicals in the second processing region comprises:

generating a plasma comprising the nitrogen-containing radicals in a remote plasma source (RPS), wherein the plasma is formed from a process gas comprising nitrogen and an inert gas; and flowing the nitrogen-containing radicals into the second processing region of the second processing chamber where the substrate is disposed.

10. The method of claim 9, further comprising flowing the plasma comprising the nitrogen-containing radicals through an ion filter to remove substantially all ions from the plasma prior to flowing the nitrogen-containing radicals into the second processing region.

11. The method of claim 10, wherein the process gas comprises from about 5% to about 20% nitrogen and the remainder the inert gas, the inert gas is argon.

12. The method of claim 7, further comprising alternating exposing the boron-tungsten nucleation layer to the nitrogen-containing radicals in the second processing region to passivate exposed portions of the boron-tungsten nucleation layer and exposing the at least one feature to the second tungsten-containing precursor gas to form the tungsten fill layer over the boron-tungsten nucleation layer.

13. The method of claim 7, wherein exposing the tungsten liner layer to the first tungsten-containing precursor and the reducing agent comprises repeating cycles of alternately exposing the tungsten liner layer to the first tungsten-containing precursor and the reducing agent.

14. The method of claim 13, wherein the first tungsten-containing precursor is WF6 and the reducing containing agent is $B_2H_6$.

15. A method for processing a semiconductor device structure, comprising:

exposing a top opening of a feature formed in a substrate to a physical vapor deposition (PVD) process to deposit a tungsten liner layer within the feature, wherein the PVD process is performed in a first processing region of a first processing chamber and the tungsten liner layer forms an overhang portion, wherein the tungsten liner layer forms the overhang portion extending inward from the top opening of the feature, which partially obstructs the top opening of the feature;

transferring the substrate from the first processing region of the first processing chamber to a second processing region of a second processing chamber without breaking vacuum;

exposing the overhang portion at the top opening of the feature to nitrogen-containing radicals in the second processing region to inhibit subsequent growth of tungsten along the overhang portion; and exposing the feature to a tungsten-containing precursor gas to form a tungsten fill layer over the tungsten liner layer within the feature in the second processing region, wherein exposing the overhang portion to the nitrogen-containing radicals is performed at a first pressure, and deposition of the tungsten fill layer is initiated at a second pressure that is higher than the first pressure, and wherein exposing the overhang portion to the nitrogen-containing radicals is performed prior to initiating deposition of the tungsten fill layer.

16. The method of claim 15, wherein exposing the feature to the tungsten-containing precursor gas to form the tungsten fill layer over the tungsten liner layer comprises a chemical vapor deposition (CVD) process.

17. The method of claim 15, wherein exposing the overhang portion to the nitrogen-containing radicals in the second processing region comprises:

generating a plasma comprising the nitrogen-containing radicals in a remote plasma source (RPS), wherein the plasma is formed from a process gas comprising nitrogen and an inert gas; and flowing the nitrogen-containing radicals into the second processing region of the second processing chamber where the substrate is disposed.

18. The method of claim 17, further comprising flowing the plasma comprising the nitrogen-containing radicals through an ion filter to remove substantially all ions from the plasma prior to flowing the nitrogen-containing radicals into the second processing region.

19. The method of claim 18, wherein the process gas comprises from about 5% to about 20% nitrogen and the remainder the inert gas, the inert gas is argon.

20. The method of claim 15, further comprising alternating exposing the overhang portion to the nitrogen-containing radicals in the second processing region to inhibit subsequent growth of tungsten along the overhang portion and exposing the feature to the tungsten-containing precursor gas to form the tungsten fill layer over the tungsten liner layer.

* * * * *